United States Patent
Casey et al.

(10) Patent No.: US 10,291,192 B1
(45) Date of Patent: May 14, 2019

(54) PROGRAMMABLE BUFFERING, BANDWIDTH EXTENSION AND PRE-EMPHASIS OF A TRACK-AND-HOLD CIRCUIT USING SERIES INDUCTANCE

(71) Applicant: Xilinx, Inc., San Jose, CA (US)

(72) Inventors: Ronan Casey, Cork (IE); Chi Fung Poon, Sunnyvale, CA (US); Ilias Chlis, Cork (IE); Junho Cho, San Jose, CA (US)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 15/916,887

(22) Filed: Mar. 9, 2018

(51) Int. Cl.
*H03F 3/187* (2006.01)
*H03F 3/45* (2006.01)
*H03G 1/00* (2006.01)

(52) U.S. Cl.
CPC ....... *H03F 3/45977* (2013.01); *H03G 1/0029* (2013.01); *H03G 1/0088* (2013.01); *H03F 2200/405* (2013.01); *H03F 2203/45332* (2013.01); *H03F 2203/45554* (2013.01); *H03F 2203/45608* (2013.01)

(58) Field of Classification Search
CPC .............................. H03F 3/187; H03F 3/45892
USPC .................................................... 330/307, 9
See application file for complete search history.

(56) References Cited

U.S. PATENT DOCUMENTS

| | | | | |
|---|---|---|---|---|
| 7,159,138 | B2* | 1/2007 | Aberl ................. | G06F 13/4291 713/401 |
| 8,111,566 | B1* | 2/2012 | Wang ................. | G06F 13/4234 365/191 |
| 8,279,690 | B1* | 10/2012 | Wang ................. | G06F 13/4234 365/191 |

OTHER PUBLICATIONS

Frans, Yohan, et al. 56Gb/s PAM4 Wireline transceiver Using a 32-way Time-Interleaved SAR ADC in 16nm FinFET. IEEE Journal of Solid-State Circuits, vol. 52, Issue 4, Apr. 2017 [online], [retrieved on Oct. 12, 2017]. Retrieved from the Internet <URL: http://ieeexplore.ieee.org/stamp/stamp.jsp?arnumber=7811205>.

(Continued)

*Primary Examiner* — Henry Choe
(74) *Attorney, Agent, or Firm* — Craige Thompson

(57) ABSTRACT

Apparatus and associated methods relate to a peaking module fabricated on a semiconductor substrate including a follower circuit driving a series peaking circuit-branch, the module configured to extend the bandwidth of a track-and-hold circuit. In an illustrative example, the series peaking circuit-branch may include an inductive element. One or more tracks on a metal interconnect above the semiconductor substrate may form the inductive element, for example. In some examples, one or more peaking modules may be combined creating a customized frequency response. In some examples, one or more combined peaking modules may be adjusted by a controller providing dynamic frequency response customization during operation. The follower circuits may employ constant current biasing and/or constant-$g_m$ biasing to provide substantial immunity to process, temperature and voltage variations, for example. Various implementations of series peaking circuit-branch pre-emphasis may advantageously extend overall bandwidth of various circuits (e.g., high-speed track-and-hold circuits).

20 Claims, 15 Drawing Sheets

(56) References Cited

OTHER PUBLICATIONS

Tretter, Gregor, et al. A 55-GHz-Bandwidth Track-and-Hold Amplifier in 28-nm Low-Power CMOS. IEEE Transactions on Circuits and Systems—II: Express Briefs, vol. 63, No. 3, Mar. 2016 [online], [retrieved on Oct. 12, 2017]. Retrieved from the Internet <URL: http://ieeexplore.ieee.org/stamp/stamp.jsp?arnumber=7336504>.

Shekhar, Sudip, et al. Bandwidth Extension Techniques for CMOS Amplifiers. IEEE Journal of Solid-State Circuits, vol. 41, No. 11, Nov. 2006 [online], [retrieved on Oct. 12, 2017]. Retrieved from the Internet <URL: http://ieeexplore.ieee.org/stamp/stamp.jsp?arnumber=1717666>.

Tang, Hua. Biasing, References and Regulators, Chapter 7. University of Minnesota Duluth, ECE 5211 Lecture Notes, Nov. 15, 2012 [online], [Retrieved on Oct. 12, 2017]. Retrieved from the Internet <URL: http://www.d.umn.edu/~htang/ECE5211_doc_files/ECE5211_files/Chapter7.pdf>.

Razavi, Behzad. Design of Analog CMOS Integrated Circuits. Bandgap References. [online]. International Edition. New York, NY: McGraw-Hill, 2001 [retrieved on Oct. 12, 2017]. Retrieved from the Internet <URL: https://www.amazon.com/Design-Analog-CMOS-Integrated-Circuits/dp/0072380322> Chapter 11, p. 392, ISBN-10 0-07-238032-2.

\* cited by examiner

PROGRAMMABLE BUFFERING, BANDWIDTH EXTENSION AND PRE-EMPHASIS OF A TRACK-AND-HOLD CIRCUIT USING SERIES INDUCTANCE

TECHNICAL FIELD

Various embodiments relate generally to integrated circuits (ICs) and, in particular, to circuit modules that provide frequency compensation.

BACKGROUND

An analog-to-digital conversion (ADC) system generally receives an input analog signal and converts the signal to a digital coded value. ADC systems are largely integrated and replicated onto semiconductor wafers. The individual circuits are then cut into individual die, lead bonded and packaged for use in a final application. ADC systems may receive analog voltage and/or current signals representing various parameters from the real world (e.g., temperature, pressure, illumination), and may convert them to a digital form for consumption by a digital processor, such as a computer.

The conversion process may occur in stages, for example, sample-and-hold, quantize and encode. A sample-and-hold circuit samples the input analog signal and holds the sampled analog value in time. The sample-and-hold circuit may hold that sampled value, at least long enough for an encoder circuit to determine a unique digital code for the sampled input analog signal. The digital code may be assigned based on its correlation to one of a number of discrete quanta from a quantizer.

To improve the overall conversion speed of the ADC system, two or more ADCs may be employed in a time-interleaved fashion. In a time-interleaved ADC, each ADC block may convert a time slice portion of the overall signal.

SUMMARY

Apparatus and associated methods relate to a peaking module fabricated on a semiconductor substrate including a follower circuit driving a series peaking circuit-branch, the module configured to extend the bandwidth of a track-and-hold circuit. In an illustrative example, the series peaking circuit-branch may include an inductive element. One or more tracks on a metal interconnect above the semiconductor substrate may form the inductive element, for example. In some examples, one or more peaking modules may be combined creating a customized frequency response. In some examples, one or more combined peaking modules may be adjusted by a controller providing dynamic frequency response customization during operation. The follower circuits may employ constant current biasing and/or constant-gm biasing to provide substantial immunity to process, temperature and voltage variations, for example. Various implementations of series peaking circuit-branch pre-emphasis may advantageously extend overall bandwidth of various circuits (e.g., high-speed track-and-hold circuits).

Various embodiments may achieve one or more advantages. For example, some embodiments may provide a signal pre-emphasis function, which may correct for a de-emphasis effect inherent in high-speed track-and-hold circuits. Some examples of high-speed track-and-hold circuits may be implemented in various analog-to-digital converters (ADCs). Some embodiments may provide improved linearity of output signal amplitude both over frequency and over a range of input amplitude. Improved linearity may advantageously allow for straight forward down-stream circuit designs, which may provide space savings on semiconductor substrates, reducing parasitics and overall cost per die. Improved linearity may provide bandwidth extension as it produces higher amplitude high-speed signals, which may advantageously ease signal detection for down-stream circuits. Various embodiments may mitigate signal ringing and may put less stress on switching elements in down-stream load circuits and may mitigate signal corruption. Various embodiments may buffer and/or protect preceding driving buffers from downstream load increases, providing power-efficient capacitance buffering. The bandwidth extension and/or peaking may be power and/or area efficient, in some examples, due to implementation with passive inductance. The passive inductances may, in various examples, be the metal interconnect connections themselves (e.g., connections, traces, wires, tracks, vias). Finally, various implementations may provide process, temperature and voltage sensitivity reduction.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION

To aid understanding, this document is organized as follows. First, a programmable integrated circuit (IC) is briefly introduced with reference to FIGS. 1A and 1B. The concepts described herein may be implemented on an IC, such as the IC described in FIGS. 1A and 1B. Second, with reference to FIG. 2 an exemplary application is described. Next, with reference to FIGS. 3-4, exemplary pre-buffer stages are described with associated frequency responses. Next, in FIG. 5 the pre-buffers are applied to a time-interleaved analog-to-digital converter (ADC). With reference to FIGS. 6A and 6B, an exemplary pre-buffer is described in further detail. Next, FIGS. 7-9 describe an exemplary programmable pre-buffer, and an exemplary implementation within a control loop. FIGS. 10-12C describe various current source implementations that may be combined and employed within the pre-buffers to stabilize performance over process, voltage and/or temperature. Finally, with reference to FIGS. 13A and 13B, various follower topologies (e.g., source follower, emitter follower) that may be used in the pre-buffer, are discussed.

Figure 1A:
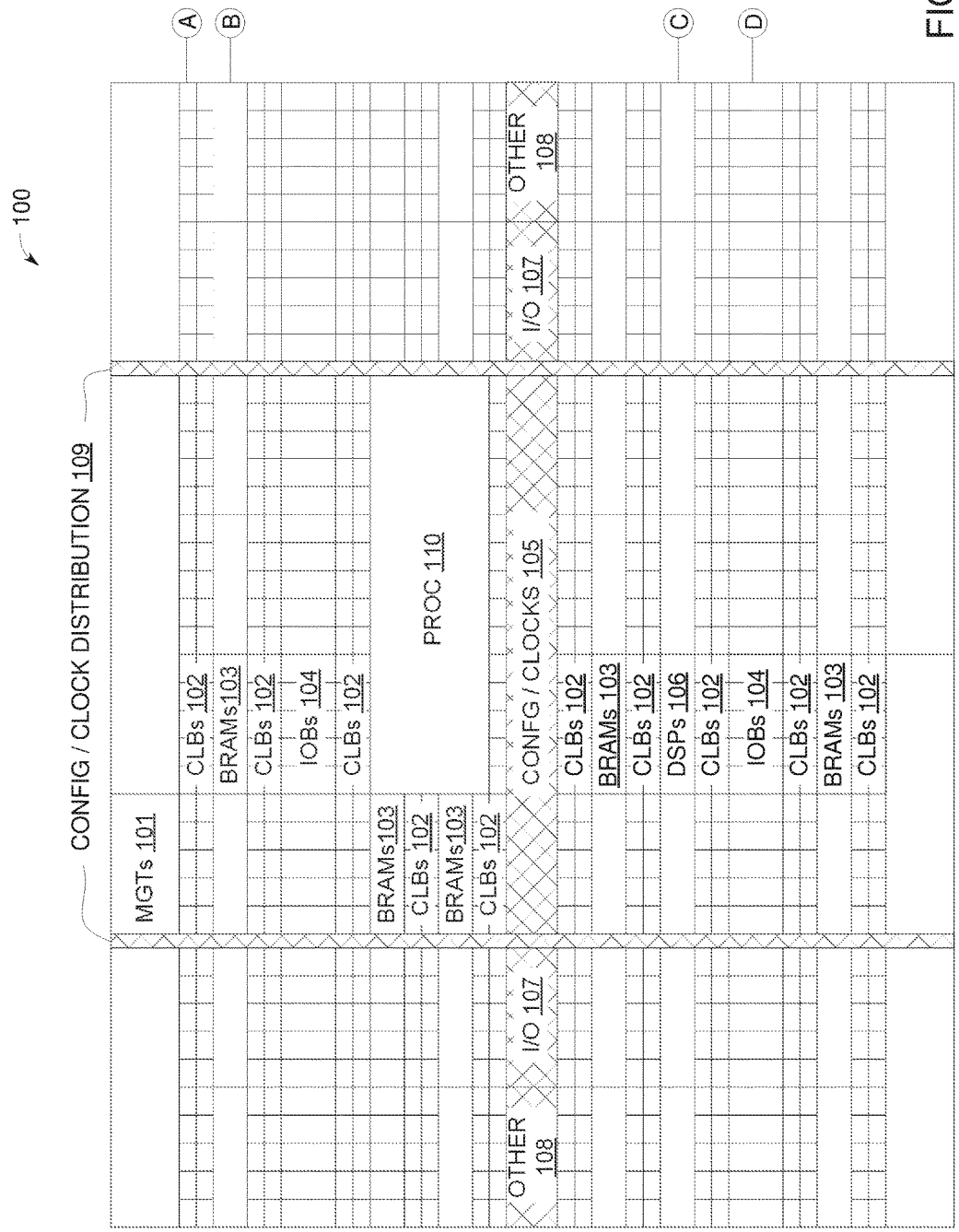
FIGS. 1A and 1B depict an exemplary programmable integrated circuit (IC) on which the disclosed circuits and processes may be implemented.
Figure 1B:
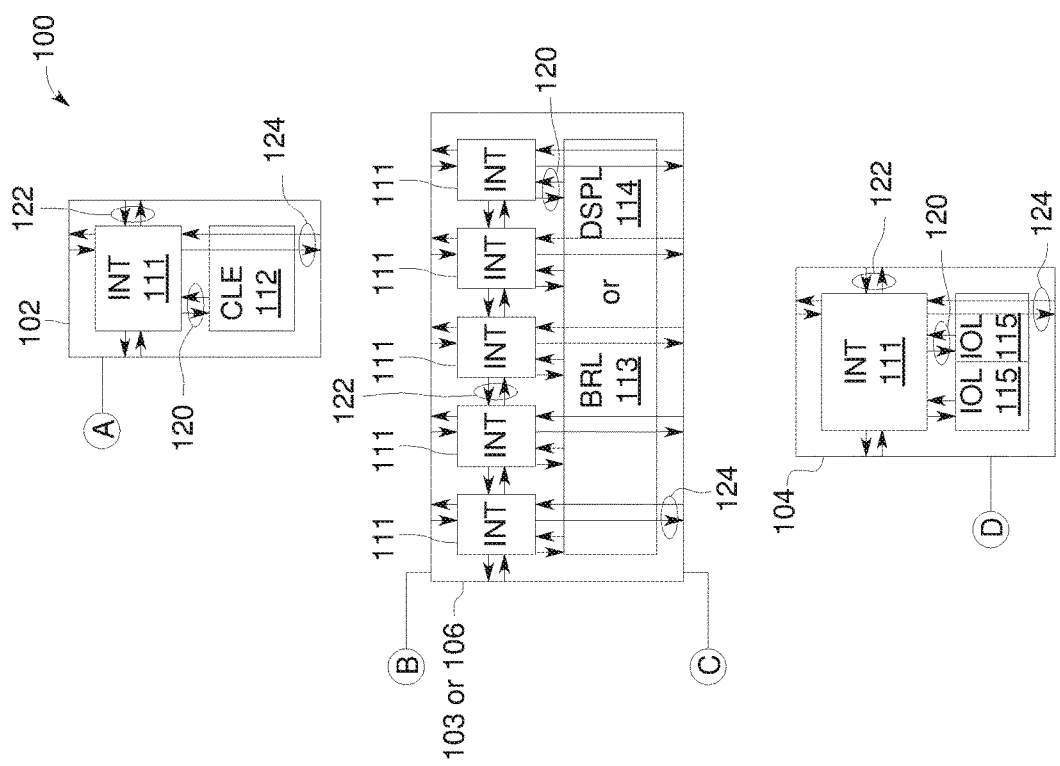

FIGS. 1A and 1B depict an exemplary programmable integrated circuit (IC) on which the disclosed circuits and processes may be implemented. FIGS. 1A and 1B will be described in combination. The connections between FIGS. 1A and 1B are depicted as circle points A, B, C and D. A programmable IC 100 includes field programmable gate array (FPGA) logic. The programmable IC 100 may be implemented with various programmable resources and may be referred to as a System on Chip (SOC). FPGA logic may include several diverse types of programmable logic blocks in the array.

For example, FIG. 1A and FIG. 1B illustrate a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include interleaved high-speed ADCs.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1B. The programmable interconnect element INT 111 includes the inter-INT-connections 122 to and from the programmable interconnect element INT 111 within the same tile, as shown by the examples included in FIG. 1B.

For example, a CLB 102 may include a configurable logic element CLE 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An 10B 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1A) is used for configuration, clock, and other control logic. Horizontal areas 109 extending from the column distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 1A and FIG. 1B include additional logic blocks that disrupt the regular columnar structure making up a large part of the programmable IC. The additional logic blocks may be programmable blocks and/or dedicated logic. For example, the processor block PROC 110 shown in FIG. 1A spans several columns of CLBs 102 and BRAMs 103.

Note that FIG. 1A and FIG. 1B are intended to illustrate only an example of programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic.

Figure 2:
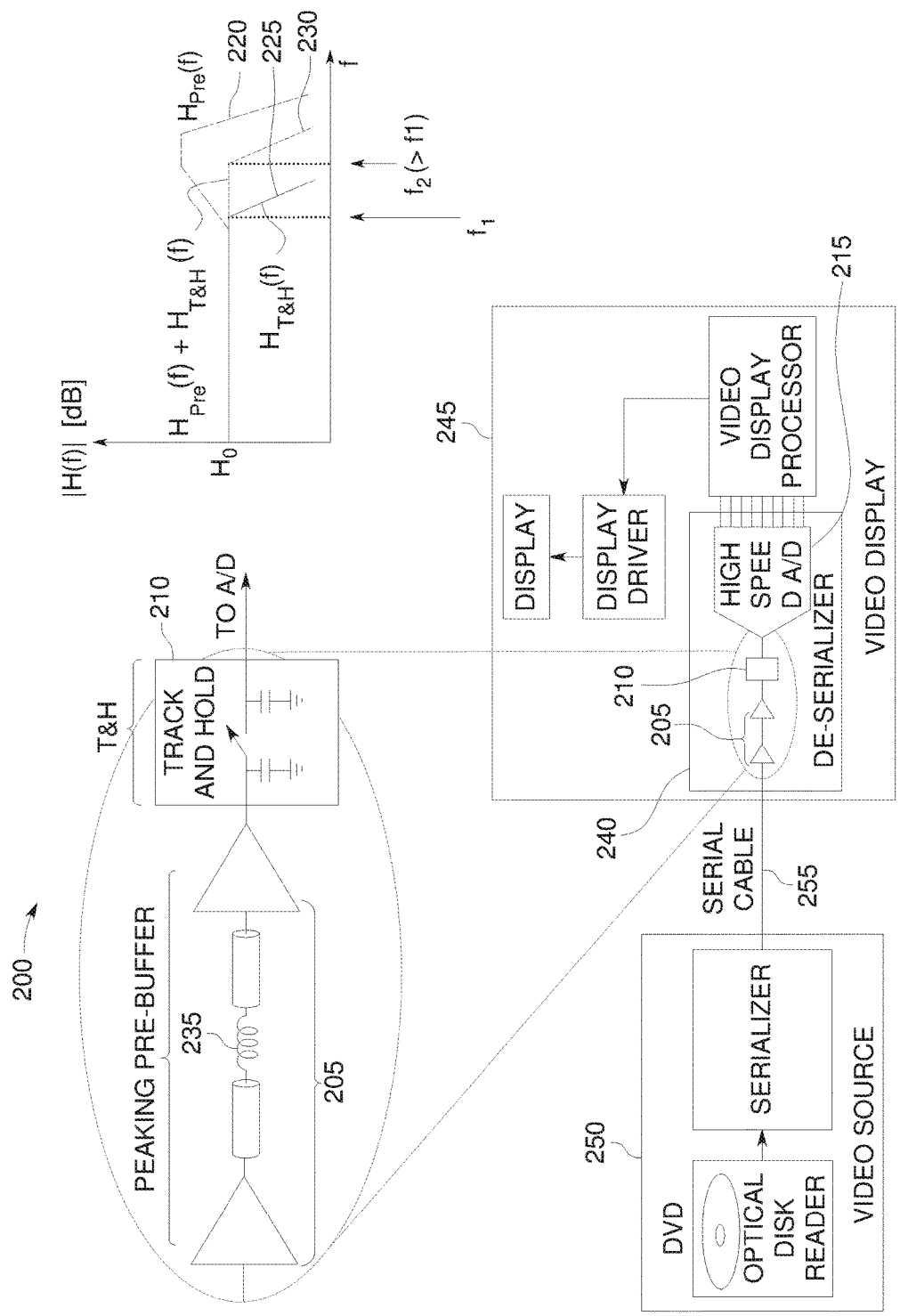
FIG. 2 depicts an exemplary peaking pre-buffer implemented within a deserializer integrated circuit or module, the pre-buffer extending the bandwidth of a data path.

FIG. 2 depicts an exemplary peaking pre-buffer implemented within a deserializer integrated circuit or module, the pre-buffer extending the bandwidth of a data path. A pre-buffer application example 200 includes a peaking pre-buffer 205. The peaking pre-buffer 205 is depicted driving a sample-and-hold circuit 210. The sample-and-hold circuit 210 drives an analog-to-digital converter ADC 215. The peaking pre-buffer 205 has a frequency response 220. The track-and-hold circuit 210 has a frequency response 225. The combination of the peaking pre-buffer 205 and the track-and-hold circuit 210 has a frequency response 230. The peaked response of the peaking pre-buffer 205 produced by an inductive element 235 may advantageously extend the aggregate bandwidth of the peaking pre-buffer 205 and track-and-hold circuit 210 beyond that of the standalone track-and-hold circuit 210.

The peaking pre-buffer 205 is included in a deserializer unit 240. The deserializer unit 240 is included in a video display 245 (e.g., an LCD monitor). The peaking pre-buffer 205 within the deserializer unit 240 receives a high-speed serial data stream from a video source 250 via a high-speed serial data cable 255. The video display 245 may advantageously benefit from the extended bandwidth of the track-and-hold circuit 210 (due to the peaking pre-buffer 205) by producing video images with higher resolution, for example.

In various embodiments, the peaking pre-buffer 205 may extend the bandwidth in the data path of a clock-and-data-recovery (CDR) circuit. The CDR may be employed in a wireline serializer/deserializer (SERDES) paradigm. The CDR may employ an ADC, such as ADC 215, to digitize a received signal, in order to allow post-processing in the digital domain. This post-processing may extract both the received data and clock, for example. This technique may facilitate 2-level or 4-level or 8-level pulse amplitude modulation (PAM2, PAM4 or PAM8). In various examples, the peaking pre-buffer 205 may be employed in a high-speed interleaved ADC. The high-speed interleaved ADC may be employed in a SERDES implementation within one or more MGTs (FIG. 1, item 101) on an FPGA, for example.

In some implementations, a wireless radio frequency (RF) paradigm may digitize and extract data from a direct-converted or down-converted high-frequency RF signal using an ADC in the data signal chain. The wireline SERDES and wireless RF ADCs may be offered in System On Chip (SOC) integrated circuits, such as those that include FPGAs, memories and microprocessors, for example.

Figure 3:
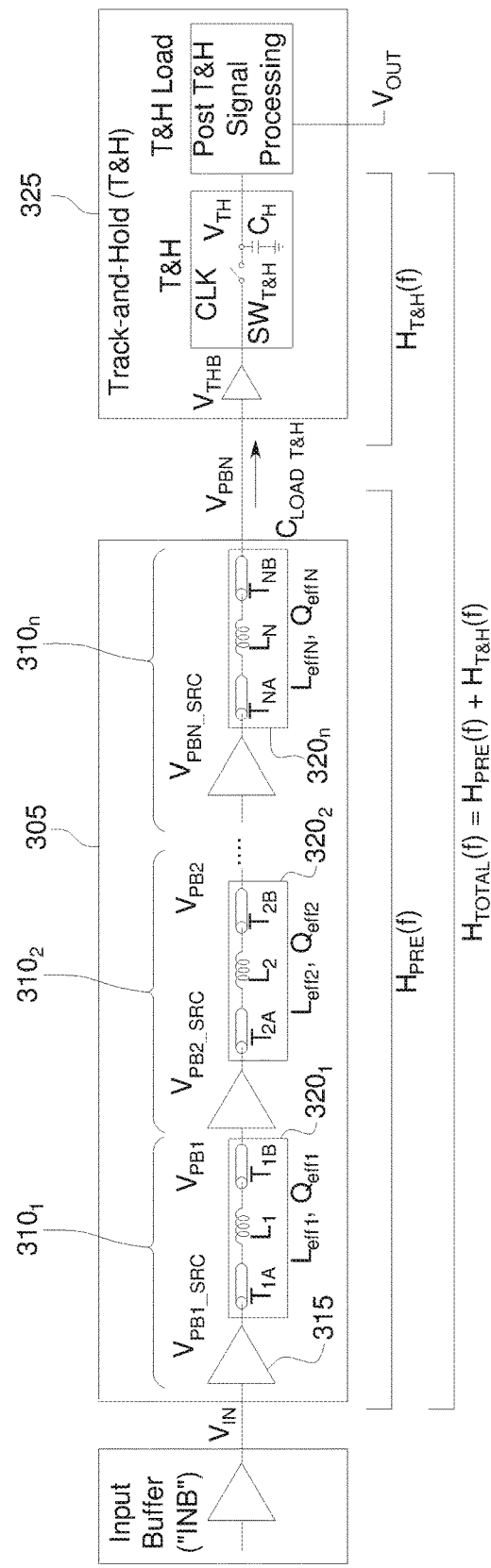
FIG. 3 depicts an exemplary pre-buffer including one or more exemplary pre-emphasis modules.

FIG. 3 depicts an exemplary pre-buffer including one or more exemplary pre-emphasis modules. A pre-buffer module 305 may be fabricated on a semiconductor substrate. The pre-buffer module 305 includes one or more pre-emphasis buffers $310_1$, $310_2$, $310_n$ (hereinafter collectively referred to as "pre-emphasis buffers 310"). Each pre-emphasis buffer 310 includes a follower buffer 315 (e.g., source follower, emitter follower). Each follower buffer 315 drives a peaking network $320_1$, $320_2$, $320_n$ (hereinafter collectively referred to as "peaking networks 320"). The peaking networks 320 each include an associated inductor $L_1$, $L_2$, $L_N$. In the depicted example, the inductors $L_1$, $L_2$, $L_N$ may represent explicit integrated inductors. $T_{1A}$, $T_{1B}$, $T_{2A}$, $T_{2B}$, $T_{NA}$, $T_{NB}$ are implicit inductors representing metal interconnections between sub-circuits. All the inductances, represented by inductors $L_1$, $L_2$, $L_N$, $T_{1A}$, $T_{1B}$, $T_{2A}$, $T_{2B}$, $T_{NA}$, $T_{NB}$, may represent metal interconnections situated above the semiconductor substrate. When combined with the follower buffers 315 and a load capacitance $C_{LOAD}$, the inductors $L_1$, $L_2$, $L_N$ may each provide a peaked response.

In an exemplary aspect, each of the follower buffers 315 in combination with the coupled peaking networks 320 may drive a $C_{LOAD}$ of a successive follower buffer 315 or may drive a $C_{LOAD}$ of a load circuit in order to produce the peaking function. The $C_{LOAD}$ may be present on the output of each peaking network 320 (e.g., input capacitance of the load circuits) in order to produce the resonance of a combined circuit ($C_{LOAD}$ with peaking network 320) and to produce the peaking functions described herein.

Figure 4:
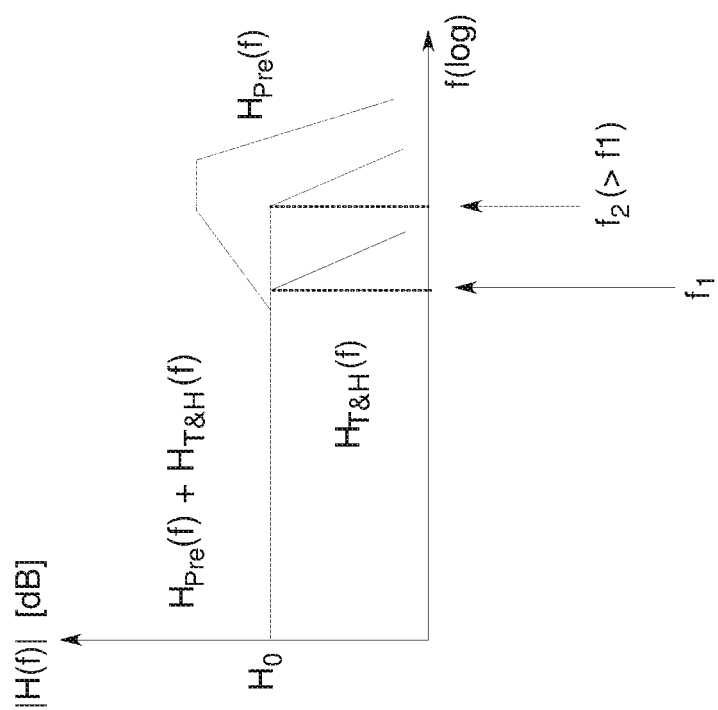
FIG. 4 depicts a set of transfer functions for the exemplary pre-emphasis buffer and track-and-hold modules, the combination illustrating an extended bandwidth.

The aggregate of the peak responses may be represented by the response $H_{PRE}(f)$ in FIG. 4. The response $H_{PRE}(f)$ may advantageously combine with the response from an exemplary track-and-hold module 325 $H_{T\&H}(f)$ in FIG. 4 to produce an overall response $H_{PRE}(f)+H_{T\&H}(f)$ in FIG. 4. In various examples, the one or more pre-emphasis buffers 310 may advantageously control an amplitude of greater-than-unity gain. The peaked response produced by the inductors $L_1$, $L_2$, $L_N$ in the one or more pre-emphasis buffers 310 may advantageously extend the bandwidth of the track-and-hold module 325. The overall frequency response $H_{PRE}(f)+H_{T\&H}(f)$ with the extended bandwidth may exhibit substantially flat magnitude frequency response and substantially low phase distortion. These properties may mitigate ringing in the time-domain response of the combined pre-emphasis buffer 310 plus track-and-hold module 325 at the track-and-hold sampling instant. In various embodiments, the ringing may be limited to half the size of an ADC quantization step.

In various implementations, the pre-emphasis buffers 310 may be power-efficient capacitance buffers. The inductances, represented by inductors $L_1$, $L_2$, $L_N$, $T_{1A}$, $T_{1B}$, $T_{2A}$, $T_{2B}$, $T_{NA}$, $T_{NB}$, may advantageously protect the pre-emphasis buffers 310 from current surges due to large load capacitances at the input of the track-and-hold module 325. Further, the inductances, represented by inductors $L_1$, $L_2$, $L_N$, $T_{1A}$, $T_{1B}$, $T_{2A}$, $T_{2B}$, $T_{NA}$, $T_{NB}$, may advantageously extend the bandwidth of the capacitance buffer.

The opening and closing of various track-and-hold circuit switches may cause time-domain ringing due to V=L*di/dt. The pre-emphasis buffers 310 may mitigate these potential damaging effects of ringing.

FIG. 4 depicts a set of transfer functions for the exemplary pre-emphasis buffer and track-and-hold modules, the combination illustrating an extended bandwidth. The response $H_{PRE}(f)$ may advantageously combine with the response from the track-and-hold module 325 $H_{T\&H}(f)$ to produce an overall response $H_{PRE}(f)+H_{T\&H}(f)$. The peaked response produced by the inductors represented by inductors $L_1$, $L_2$, $L_N$, $T_{1A}$, $T_{1B}$, $T_{2A}$, $T_{2B}$, $T_{NA}$, $T_{NB}$, L1, L2, $L_N$, in the one or more pre-emphasis buffers 310, may advantageously extend the bandwidth of the track-and-hold module 325. For example, as depicted in the exemplary transfer function graph FIG. 4, the magnitude response roll-off of the track-and-hold module 325 at a frequency f1, may be extended to a frequency f2 when combined with the response of the one or more pre-emphasis buffers 310. Accordingly, the aggregate of the one or more pre-emphasis buffers 310 using series inductance (e.g., inductors L1, L2, LN) may advantageously extend the bandwidth of an overall system.

Figure 5:
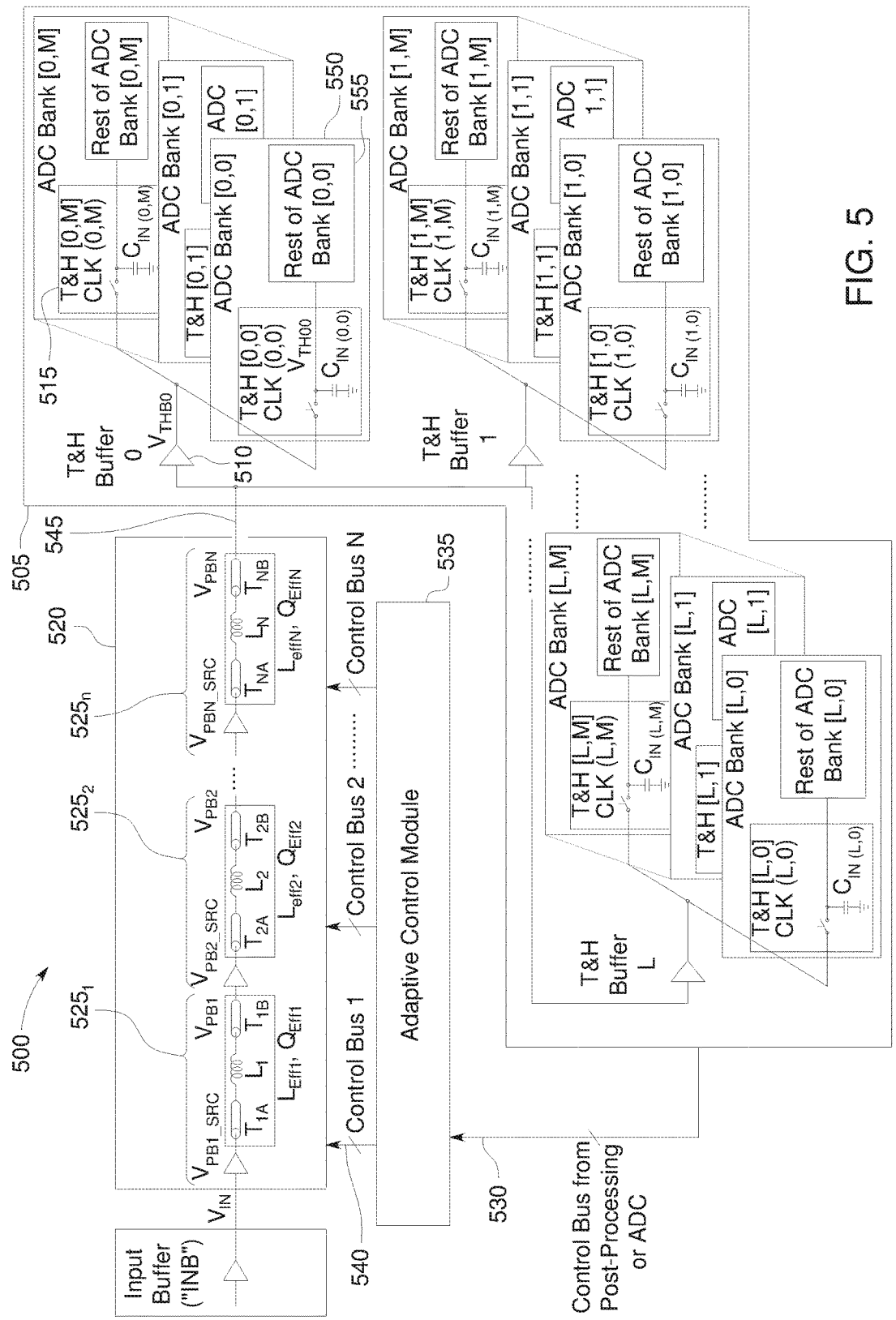
FIG. 5 depicts an exemplary set of pre-emphasis circuits driving a time-interleaved analog-to-digital converter (ADC).
Figure 6A:
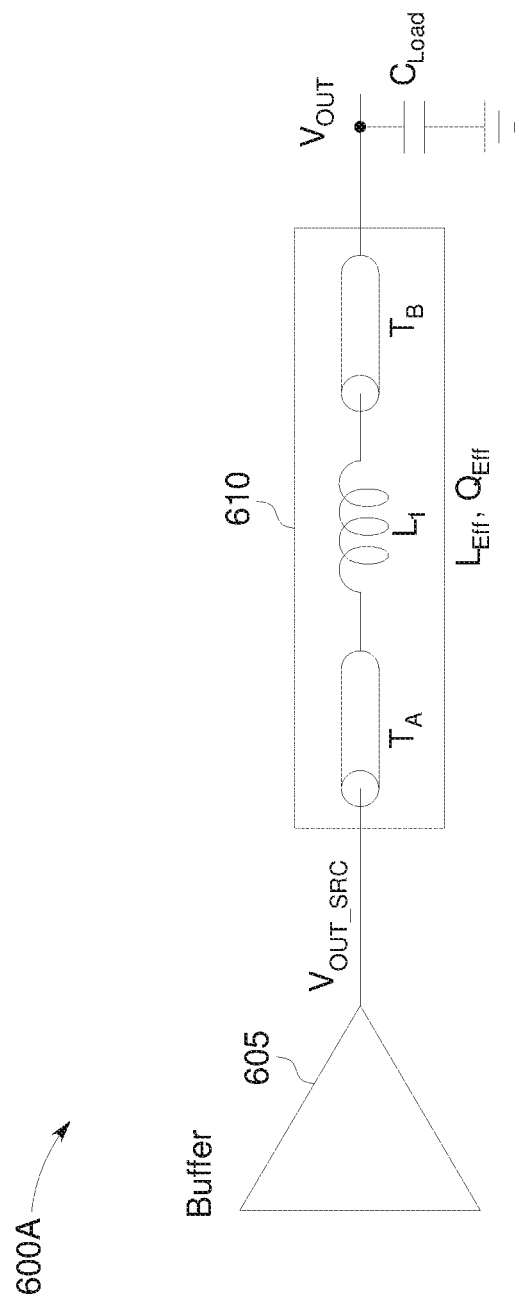
FIG. 6A depicts an exemplary pre-emphasis module.
Figure 6B:
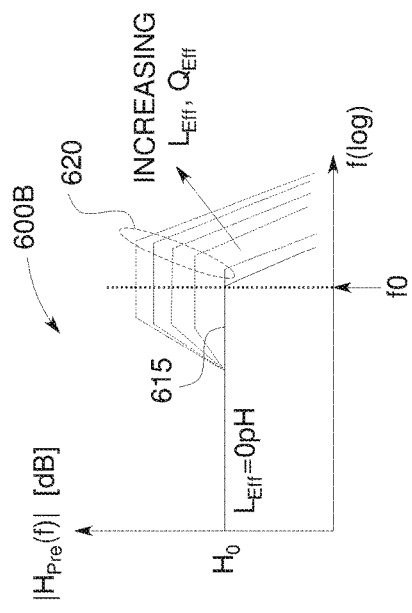
FIG. 6B depicts bandwidth extension of an exemplary pre-emphasis module.

FIG. 5 depicts an exemplary set of pre-emphasis circuits driving a time-interleaved analog-to-digital converter (ADC). A high ADC sampling rate may be achieved by implementation of multiple lower sampling rate ADCs (sub-ADCs) in parallel. Each sub-ADC may execute a conversion with a unique, but well-defined, sampling clock phase offset. This implementation may be known as a time-interleaved ADC. To increase the overall ADC sampling rate, the number of sub-ADCs may be increased at the cost of higher power consumption. Adding sub-ADCs may also increase the loading burden on the ADC sample-and-hold switches, and/or preceding buffers, which may lower their bandwidth.

A mixed-signal (analog and digital) subsystem 500 includes a time-interleaved ADC 505. The time-interleaved ADC 505 includes one or more track-and-hold buffers 510 and one or more track-and-hold switch blocks 515. A pre-buffer 520 drives the input to the time-interleaved ADC 505. The pre-buffer 520 includes one or more pre-emphasis stages $525_1$, $525_2$, $525_n$ (hereinafter collectively referred to as "pre-emphasis stages 525"). The pre-emphasis stages 525 within the pre-buffer 520 may advantageously increase the bandwidth and flatten the response of the mixed-signal subsystem 500.

In the depicted example, the mixed-signal subsystem 500 includes a control bus 530. The control bus 530 may originate from a post processor or the time-interleaved ADC 505. The control bus 530 controls an adaptive control module 535. The adaptive control module 535 generates one or more signals on one or more output control buses 540. The output control buses 540 received by the pre-buffer 520 may individually control the response of each individual pre-emphasis stage 525. The adaptive control module 535 is part of a control loop. The control loop may adaptively and continuously adjust the performance of the mixed-signal subsystem 500. In an illustrative example, a signal input VIN may be fed into the pre-buffer 520. The signal may be peaked/emphasized by the pre-buffer 520 then sent to the time-interleaved ADC 505 at ADC input 545. The time-interleaved ADC 505 may include a post processing circuit that provides an error signal in response to the pre-emphasized ADC input 545 in comparison with a flat response reference. The error signal may be the control bus 530. The adaptive control module 535 then adjusts its output control buses 540 in response to the error signal. Accordingly, the adaptive control module 535 within the control loop may continuously adjust a frequency response of one or more programmable pre-emphasis stages 525.

The time-interleaved ADC 505 may be configured in various ways. For example, the time-interleaved ADC 505 may be configured with one or more input track-and-hold buffers 510. Each of the track-and-hold buffers 510 may drive one or more ADC bank modules 550. Each of the one or more ADC bank modules 550 may include a track-and-hold switch block 515. Completing each of the one or more ADC bank modules 550 is the remaining ADC bank circuitry 555. Accordingly, the pre-buffer 520 may drive multiple buffers, which may in turn drive multiple ADC bank modules 550.

FIG. 6A depicts an exemplary pre-emphasis module. A pre-emphasis module 600A includes a driver 605. The driver 605 drives a signal into a trace 610. The trace 610 is electrically modeled as $T_A$ and $T_B$. The electrical trace models $T_A$ and $T_B$ may include series resistance and implicit inductance. In combination with the electrical trace models $T_A$ and $T_B$ is an explicit series inductor $L_1$. For estimation, or for electrical AC simulation purposes, the electrical trace models $T_A$ and $T_B$ and the explicit series inductor $L_1$ including its parasitics (e.g., effective series resistance (ESR)) may be lumped and represented as effective inductance ($L_{eff}$) and effective quality ($Q_{eff}$). A load capacitance $C_{LOAD}$ is coupled to the output of the physical trace $T_B$. The load capacitance $C_{LOAD}$ represents the input capacitance of a stage following the pre-emphasis module 600A. In various examples, the effective inductance ($L_{eff}$), the effective quality ($Q_{eff}$) and the load capacitance $C_{LOAD}$ may combine according to the circuit diagram of FIG. 6 to produce a peaked output response. The peaked output response produced by the effective inductor $L_{eff}$ may advantageously compensate for high-frequency losses in follow-on circuits, extending the overall bandwidth of the signal. The term "follow-on circuit" may be defined as a circuit that follows.

In various implementations, the circuit depicted in FIG. 6A may be implemented without the explicit series inductance $L_1$, which may advantageously save space. Further, each of the traces (electrical trace models $T_A$ and $T_B$) may be implemented alone or in various combinations with explicit series inductance $L_1$.

FIG. 6B depicts bandwidth extension of an exemplary pre-emphasis module. In the depicted example, a bandwidth extension graph 600B includes a family of frequency response curves. When $L_{eff}$ and/or $Q_{eff}$ are varied, a family of frequency response curves may be generated. The family of frequency response curves may represent the response of the pre-emphasis module 600A. For example, for a theoretical effective inductance ($L_{eff}$) of zero, a frequency response of the pre-emphasis module 600A may be depicted as a curve 615. In response to an increase in the effective inductance ($L_{eff}$) and effective quality ($Q_{eff}$), a corner frequency 620 is increased. In various implementations, the response may be flat or peaked. The peaked output response produced by the inductor L1 in FIG. 6A may advantageously compensate for high-frequency losses of various follow-on modules and thus extend the bandwidth of the overall signal chain. The bandwidth extension may make the circuit more power efficient for a given target bandwidth.

Figure 7:
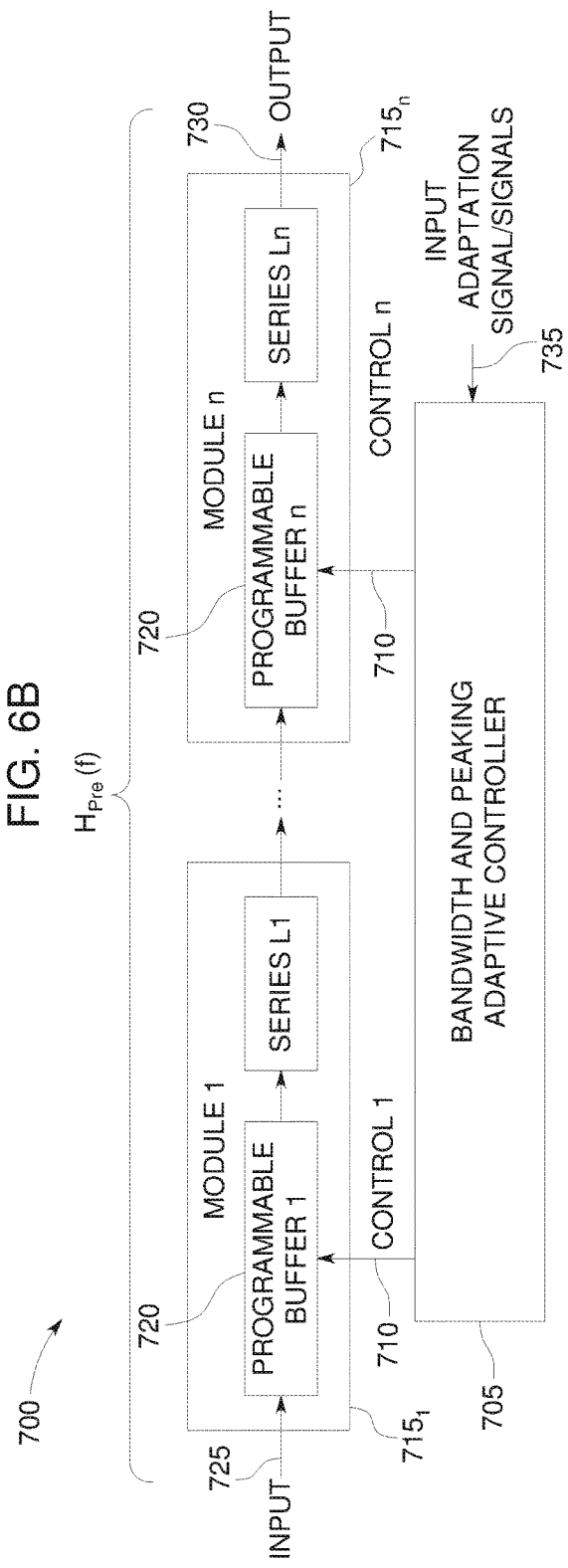
FIG. 7 depicts a cascaded series of exemplary programmable peaking/pre-emphasis modules.

FIG. 7 depicts a cascaded series of exemplary programmable peaking/pre-emphasis modules. A programmable peaking/pre-emphasis system 700 includes a controller module 705. The controller module 705 generates a set of one or more control signals 710. The control signals 710 control one or more programmable peaking/pre-emphasis modules $715_1$, $715_n$ (hereinafter collectively referred to as "programmable peaking/pre-emphasis modules 715"). The one or more programmable peaking/pre-emphasis modules 715 are configured in series. The one or more programmable peaking/pre-emphasis modules 715 include a programmable buffer 720. The programmable buffer 720 may be, for example, an array of drive buffers. The programmable buffer 720 receives one or more control signals 710. The drive buffers included in the programmable buffer 720 may drive a series inductor L1, Ln. Accordingly, the control signals 710 may control the frequency response of the programmable buffer 720.

An overall frequency response of the programmable peaking/pre-emphasis system 700 may be a combination of the individual programmable peaking/pre-emphasis modules 715. In some examples, each of the programmable peaking/pre-emphasis modules 715 may shape a particular portion of the overall frequency response of the programmable peaking/pre-emphasis system 700.

In an illustrative example, the first programmable peaking/pre-emphasis module $715_1$ receives an input signal 725. The frequency response of the input signal 725 is conditioned by each of the programmable peaking/pre-emphasis modules 715, accordingly, as the input signal 725 makes its way through the series chain. The input signal 725 is eventually output at the final programmable peaking/pre-emphasis module $715_n$ as an output signal 730. The frequency response of the output signal 730 may be peaked as illustrated in FIG. 6B, for example, to extend its bandwidth.

Accordingly, the programmable peaking/pre-emphasis system 700 may provide a customized overall frequency response. The overall frequency response may be a transfer function $H_{PRE}(f)$. The overall frequency response customization may be governed by the controller module 705. The controller module 705 may govern the frequency response of each of the individual programmable peaking/pre-emphasis modules 715, thereby shaping the overall frequency response. The overall frequency response of the programmable peaking/pre-emphasis system 700 may be customized to compensate for high-frequency loss of a follow-on circuit when driven by the programmable peaking/pre-emphasis system 700. The customized compensation may increase the overall bandwidth (e.g., cutoff frequency) of the combined peaking/pre-emphasis system 700 and follow-on circuit. This programmability may provide flexibility for different operating modes and applications. In various examples, the programmability may reduce the sensitivity of circuit variations on the overall system frequency response over process, voltage and temperature (PVT). In various implementations, methods of programmability may maintain constant DC operating point parameters such as DC Gain, output common-mode, overdrive ($V_{gs}$–$V_t$) and saturation margin for both the buffer device and the current sources, across the programmable settings.

In some embodiments, the controller module 705 may receive one or more input adaptation signals 735. Internal to the controller module 705, the input adaptation signal 735 may be latched and/or processed with digital logic circuits. In some examples, the input adaptation signal 735 may be written to a memory element. The input adaptation signal 735 may be generated by comparing a measured property or state of a signal chain (e.g., from input signal 725 to output signal 730) to an ideal or desirable property or state. Setting or defining the measured property or state may cause the programmable peaking/pre-emphasis system 700 to adjust the transfer function $H_{PRE}(f)$ to achieve a better combined transfer function $H_{PRE}(f)+H_{T\&H}(f)$ (e.g., as described in FIG. 4). The constant transfer function $H_{PRE}(f)$ may be advantageous in applications where, for example, the follow-on circuitry has a known stable frequency response. In various embodiments, the input adaptation signal 735 may be generated manually or received from an external source.

In some embodiments, the input signal 725 may be generated by a dynamic analysis circuit. The dynamic analysis circuit may cause the programmable peaking/pre-emphasis system 700 to exhibit a dynamic transfer function $H_{PRE}(f)$. The dynamic transfer function $H_{PRE}(f)$ may be advantageous in applications where the follow-on circuitry has a frequency response that varies over various conditions, for example, time, temperature, process, and/or voltage. Accordingly, the programmable peaking/pre-emphasis system 700 may adapt to variable conditions. Further, when combined with a follow-on circuit, the combined system may adapt to variable conditions, maintaining a desirable overall frequency response.

Some examples of the controller module 705 may be implemented, for example, by a processor executing pre-programmed instructions from an array of memory cells. The processor implementation may be, for example, programmed into an FPGA or microcontroller. In some examples, the controller module 705 may be implemented as digital logic, with fixed logic gates (e.g., application specific integrated circuit (ASIC)) or programmable logic (e.g., gates on an FPGA). The controller module 705 may be implemented with linear control, combinational logic alone or in combination with the digital logic. In various examples, the controller module 705 may include memory (e.g., a finite state machine).

The techniques discussed in FIG. 7 may describe automatic peaking control, which may provide adaptation and/or calibration of bandwidth in various exemplary applications. For example, in various applications (e.g., serializer/deserializers (SERDES), RF transceivers), signal non-idealities (in various combinations of the input signal 725, the programmable peaking/pre-emphasis modules 715 and the downstream application circuit) may be captured, measured, and an error signal generated. The error signal may be an input to an algorithm. The algorithm may be implemented in digital hardware or in software. Various exemplary algorithms in the automatic peaking controller module 705 may automatically control the peaking/pre-emphasis circuit to minimize this error signal (as in a negative feedback loop), thus maximizing the performance of the application. In various examples, the peaking control may occur initially (e.g., at IC powerup) or may occur continually, or may periodically provide a recalibration.

In various examples, a follow-on circuit may capture and measure a final output signal of a combined system (peaking circuit plus follow-on circuit) and may determine and send the input adaptation signal 735 to the controller module 705. In some examples, the input adaptation signal 735 may include a scalar error signal, and/or an array of error signal properties. Accordingly, adaptation logic within the controller module 705 may close a feedback loop around a programmable peaking circuit and an error signal generator within a follow-on circuit, thereby providing a real-time auto-bandwidth-and-peaking-adaptation function. In some examples, the follow-on circuit may be one or more application circuits. In some examples, the follow-on circuit may be modeled as a capacitive or resistive load. Further, in some examples, the follow-on circuit may be a sample-and-hold circuit. In some examples, the sample-and-hold circuit may include integrated buffers.

Figure 8A:
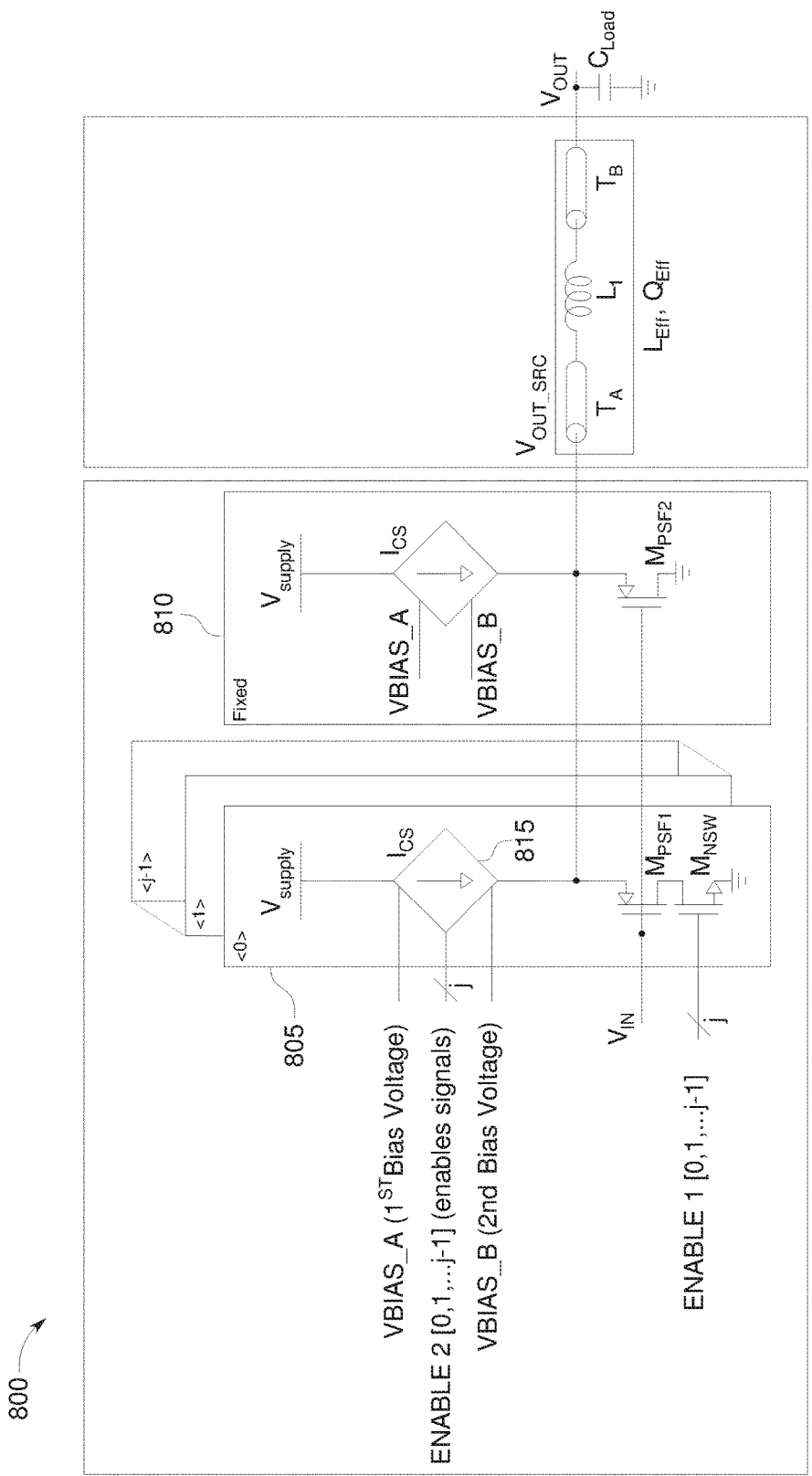
FIG. 8A depicts an exemplary programmable peaking circuit including an array of programmable source followers driving a series inductance, the circuit counteracting the effects of process, temperature and voltage variations in both itself, and in downstream circuits.

FIG. 8A depicts an exemplary programmable peaking circuit including an array of programmable source followers driving a series inductance, the circuit counteracting the effects of process, temperature and voltage variations in both itself, and in downstream circuits. A programmable peaking circuit 800 includes a source follower that is split up into one or more programmable source followers 805. The programmable source followers 805 may be implemented alone or in combination with one or more fixed source followers 810. The one or more programmable source followers 805 and the optional fixed source follower 810 may combine to drive a peaking inductive network $L_{eff}$. One or more electrical traces $T_A$ and $T_B$ and an associated peaking inductance L1 may be lumped and modeled as the peaking inductive network $L_{eff}$. The peaking inductive network $L_{eff}$ drives an output signal $V_{OUT}$. The output signal $V_{OUT}$ is coupled to a follow-on application circuit (not shown) which includes an input load capacitance $C_{LOAD}$.

The programmable source followers 805 are controlled by one or more enable signals ENABLE1 and one or more enable signals ENABLE2. The one or more enable signals ENABLE1 may be configured to open-circuit the DC connection between each individual unit of a transistor $M_{PSF1}$ and ground using a switch transistor $M_{NSW}$. The one or more enable signals ENABLE2 may be configured to turn on and off an individual current source 815. In the depicted example, the individual current sources 815 are dependent on a bias voltage VBIAS_A and a bias voltage VBIAS_B. The individual current sources 815 may be set at various predetermined values to provide a preprogrammed weighting for each individual programmable source follower 805. The output of each individual programmable source follower 805 may be turned on or off by the one or more enable signals ENABLE2. The enable signals ENABLE2 may selectively combine individual current sources 815 to shape the frequency response of a composite output signal $V_{OUT}$. Accordingly, the overall response of the programmable peaking circuit 800 may be controlled by the one or more enable signals ENABLE1 and one or more enable signals ENABLE2. In various examples, the programmable peaking circuit 800 may advantageously control an amplitude of greater-than-unity gain at high-frequency.

In an illustrative example, the individual current sources 815 may be set to provide a binary preprogrammed weighting (e.g., 1×, 2×, 4×, 8×). To generate a 5× weighting for the programmable peaking circuit 800, the enable signals ENABLE1 and ENABLE2 associated with the 1× programmable source follower 805 and the 4× programmable source follower 805 may be activated (and the 2× programmable source follower 805 and the 8× programmable source follower 805 may be deactivated). The 1× programmable source follower 805 and the 4× programmable source follower 805 may be combined to achieve the 5× weighting.

In an illustrative example, the individual current sources 815 may be set to provide a constant preprogrammed weighting (e.g., 1×, 1×, 1×, 1×). To generate a 3× weighting for the programmable peaking circuit 800, the enable signals ENABLE1 and ENABLE2 associated with three of the 1× programmable source followers 805 may be activated (and one of the 1× programmable source followers 805 may be deactivated). The three 1× programmable source followers 805 may be combined to achieve the 3× weighting.

The programmable peaking circuits 800 may be combined in series. For example, programming the individual programmable source followers 805 may provide frequency response peaking in strategic frequency bands to provide an advantageous combined (programmable peaking circuit 800 with follow-on circuit) frequency response.

In various examples, the programmable peaking circuit 800 may counteract semiconductor process, voltage and temperature variations of various load circuits (follow-on blocks). In some examples, the combined response may be substantially flat. In various programmable implementations, the DC/low-frequency gain of the circuit may be unity (0 dB). In some implementations, the individual current sources 815 may be biased by $V_{CS}$, $V_{CASC}$ (FIG. 10) such that over PVT the individual current sources 815 may provide a constant bias current (e.g., $g_m$ may vary), reducing sensitivity to PVT. Further, the individual current sources 815 may be biased with voltages associated with a blend of constant-$g_m$ and constant current. These blends may be implemented alone or in combination with the peaking inductive network $L_{eff}$. These blended circuits may include an automatic provision of substantially PVT-invariant constant current. These blended circuits may include an automatic provision of substantially PVT-invariant constant $g_m$.

The fixed source follower 810 may provide a fixed high-frequency gain level or contribution. The fixed high-frequency gain level may provide a minimum gain through the programmable peaking circuit 800. In some implementations, the fixed source follower 810 may provide the minimum gain through the circuit even when all the enable signals ENABLE1 and ENABLE2 are off. In some examples, the fixed source follower 810 may not be implemented, which may save space on a semiconductor die. In this case, at least one of the individual programmable source followers 805 may be activated in order to provide continuity between $V_{IN}$ and $V_{OUT}$.

In some examples, the method of providing substantial process, temperature and voltage sensitivity reduction may advantageously mitigate unwanted peaking and/or irreversible corruption of the signal response in the programmable peaking circuit 800, over process, voltage and/or temperature (PVT).

The circuit functions depicted in FIG. 8A may be implemented in complementary metal-oxide semiconductor (MOS) technology. Furthermore, circuit functions implemented with P-channel metal-oxide semiconductor (PMOS) devices may be implemented with N-channel metal-oxide semiconductor (NMOS) devices and circuit functions implemented with NMOS devices may be implemented with PMOS devices. Further, NMOS and PMOS device types may be implemented in circuits alone, or in combination, to achieve the programmable source followers 805 and fixed source follower 810 functions described herein.

Figure 8B:
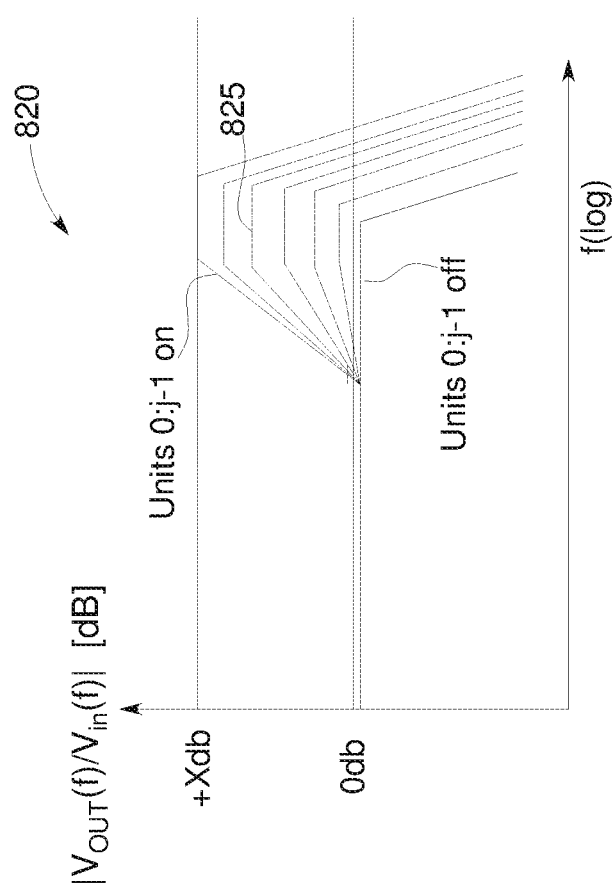
FIG. 8B depicts a frequency response of an exemplary programmable source follower with series inductance implementing a programmable pre-emphasis module.

FIG. 8B depicts a frequency response of an exemplary programmable source follower with series inductance implementing a programmable pre-emphasis module. An overall response 820 of the programmable peaking circuit 800 may be governed by $L_{eff}$, however the amount of the $L_{eff}$ effect is controlled by the programmable source followers 805, as exemplified by multiple levels 825 in the graph of the overall response 820.

Figure 9:
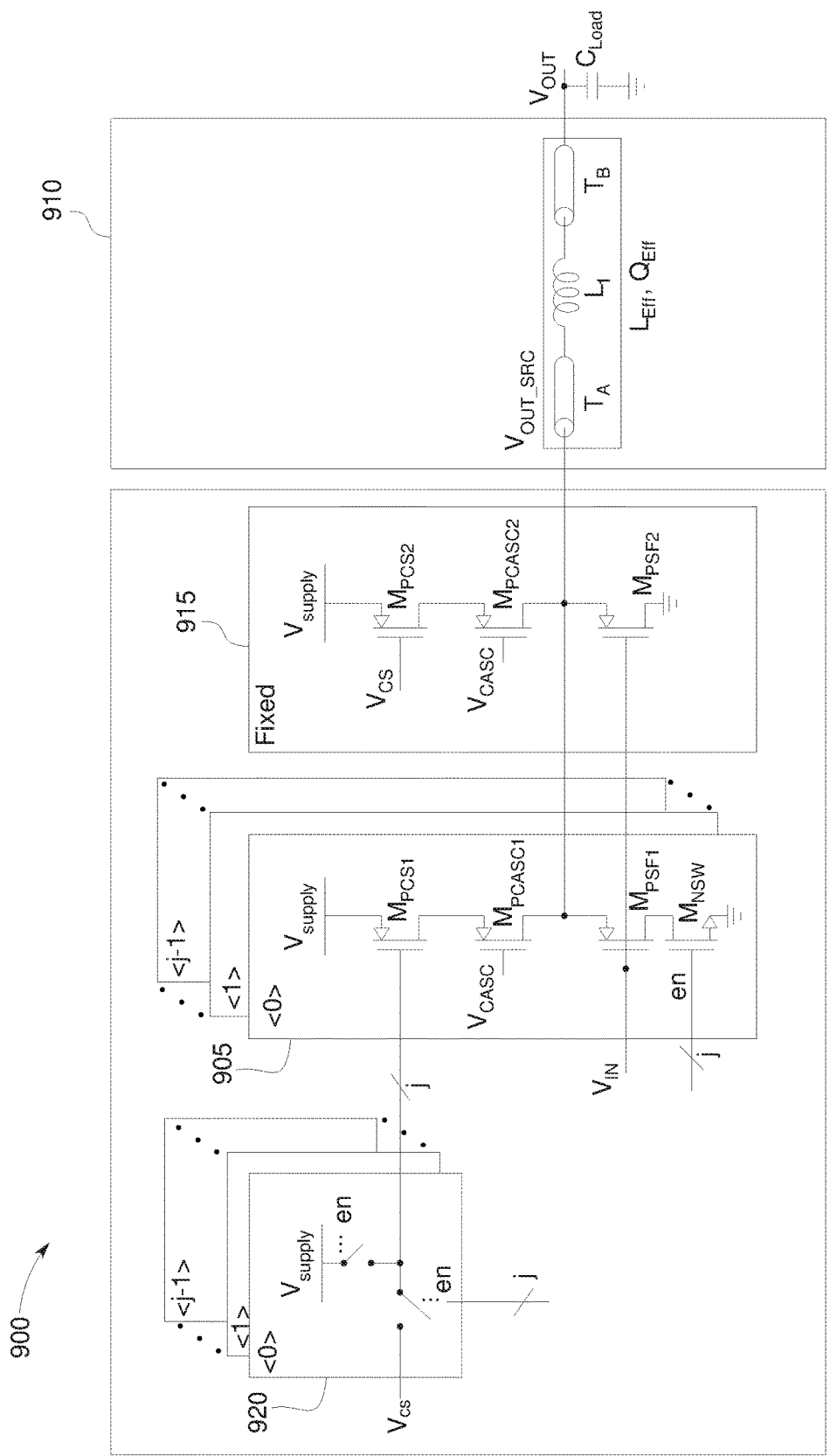
FIG. 9 depicts an exemplary implementation of a programmable peaking circuit including a programmable source follower with a cascode current source driving a series inductance and a load capacitance.

FIG. 9 depicts an exemplary implementation of a programmable peaking circuit including a programmable source follower with a cascode current source driving a series inductance and a load capacitance. A programmable peaking circuit 900 includes one or more programmable source followers 905. The programmable source followers 905 include a main current source transistor $M_{PCS1}$, a cascode transistor $M_{PCASC1}$, a buffering transistor $M_{PSF1}$ and a switch transistor MNSW. The cascode transistor $M_{PCASC1}$ may represent a cascode implementation. The programmable source followers 905 receive an input signal VIN and drive a peaking inductance module 910. The peaking inductance module 910 includes a lumped inductance model $L_{eff}$, $Q_{eff}$. The lumped inductance model $L_{eff}$, $Q_{eff}$ includes trace $T_A$, inductance $L_1$, and trace $T_B$. The peaking inductance module 910 drives a follow-on capacitive load $C_{LOAD}$. The programmable source followers 905 combine with a fixed source follower 915. The fixed source follower 915 includes a main current source transistor $M_{PCS2}$, a cascode transistor $M_{PCASC2}$ and the buffering transistor MPSF2. The current sources within the programmable source followers 905 are controlled by one or more programmable switches 920 and buffering transistors $M_{PSF1}$ are controlled by the switch transistor $M_{NSW}$. The programmable switches 920 and the switch transistor $M_{NSW}$ may be controlled by an external controller, for example.

The circuit functions depicted in FIG. 9 may be implemented in complementary metal-oxide semiconductor (MOS) technology. Furthermore, circuit functions implemented with P-channel metal-oxide semiconductor (PMOS) devices may be implemented with N-channel metal-oxide semiconductor (NMOS) devices and circuit functions implemented with NMOS devices may be implemented with PMOS devices. The circuit schematics may be redrawn accordingly, as depicted in the contrast between FIG. 13A and FIG. 13B. Further, NMOS and PMOS device types may be implemented in circuits alone, or in combination, to achieve the source follower and/or the cascode functions described herein.

The programmable switches 920 may be implemented by methods known in the art. Various switch implementation techniques may be employed alone or in combination.

Figure 10:
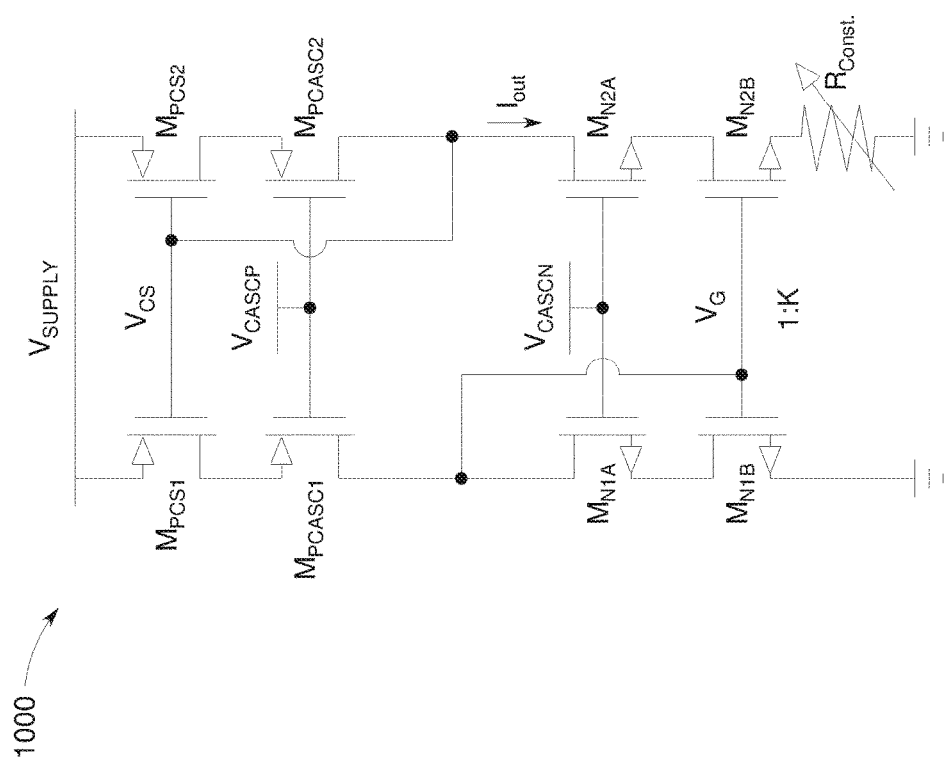
FIG. 10 depicts an exemplary constant transconductance ("$g_m$") biasing circuit with cascodes, the constant transconductance reducing bandwidth and peaking variation in a source follower circuit over process, voltage and temperature (PVT).

FIG. 10 depicts an exemplary constant transconductance ("$g_m$") biasing circuit with cascodes, the constant transconductance reducing bandwidth and peaking variation in a source follower circuit over process, voltage and temperature (PVT). This type of circuit may produce varying currents that force a substantially constant-$g_m$ reducing sensitivity to process voltage and/or temperature (PVT) if employed with a constant resistance resistor $R_{CONST}$. $R_{CONST}$ can be a resistor that is inherently constant over PVT, or a resistor that is calibrated to be constant over PVT. A constant transconductance ($g_m$) biasing circuit with cascode 1000 includes a main current source transistor $M_{PCS1}$, a cascode transistor $M_{PCASC1}$, current source transistors $M_{N1A}$ and $M_{N1B}$, a main current source transistor $M_{PCS2}$, a cascode transistor $M_{PCASC2}$, and current source transistors $M_{N2A}$ and $M_{N2B}$. In various implementations, constant-$g_m$ biasing may reduce the sensitivity of the output variations due to variations in PVT of a semiconductor circuit. Constant-$g_m$ biasing may be implemented within the current sources of various source followers (e.g., pre-buffer module 305, pre-buffer 520, pre-emphasis module 600A, programmable peaking circuit 800). The constant-$g_m$ biasing circuits may include an automatic provision of substantially PVT-invariant constant-$g_m$.

The constant transconductance ($g_m$) biasing circuit with cascode 1000 may use its internally generated bias voltages $V_{CS}$ and $V_{CASCP}$ to bias a current source in a source follower and therefore force a constant-$g_m$ within its buffering transistors. For example, in FIG. 9, the voltages on nodes $V_{CS}$ and $V_{CASC}$ can be generated from nodes $V_{CS}$ and $V_{CASC}$ respectively in FIG. 10, thus forcing a PVT-varying current in MPSF1, MPSF2 so that its $g_m$, and therefore its bandwidth, both remain constant over PVT. The PVT-varying current may reduce sensitivity of the bandwidth.

By way of example and not limitation, the individual current sources 815, in the circuit of FIG. 8A, may copy or mirror the current from the constant transconductance ($g_m$) biasing circuit with cascode 1000. Those skilled in the art may be familiar with the details of implementing a cascode current source that mirrors the current from a current branch such as the one marked $I_{out}$ in the constant transconductance ($g_m$) biasing circuit with cascode 1000 of FIG. 10, into the individual current sources 815 of FIG. 8A. In some implementations, the constant transconductance ($g_m$) biasing circuit with cascode 1000 may reduce sensitivity to PVT in a source follower with inductive peaking. In various examples, the constant transconductance ($g_m$) biasing circuit with cascode 1000 may automatically provide a substantially PVT-invariant transconductance $g_m$.

Constant-$g_m$ circuits may include a variety of topologies. For example, FIG. 10 may generate voltages that may control current sources. The current sources may be adapted to produce a constant-$g_m$ when employed in a source follower. Constant-$g_m$ biasing, when implemented in a semiconductor source follower, may reduce the sensitivity of the output impedance of the source follower over PVT, providing a more constant output impedance over PVT. Accordingly, when implemented in peaking and/or pre-emphasis circuits, constant-$g_m$ biasing may make the overall bandwidth and peaking substantially constant over PVT, particularly at frequencies at which they peak. The overall source follower (e.g., FIG. 9) output impedance is related to $1/g_m$ of the buffer transistor $M_{PSF1}$, $M_{PSF2}$.

Figure 11:
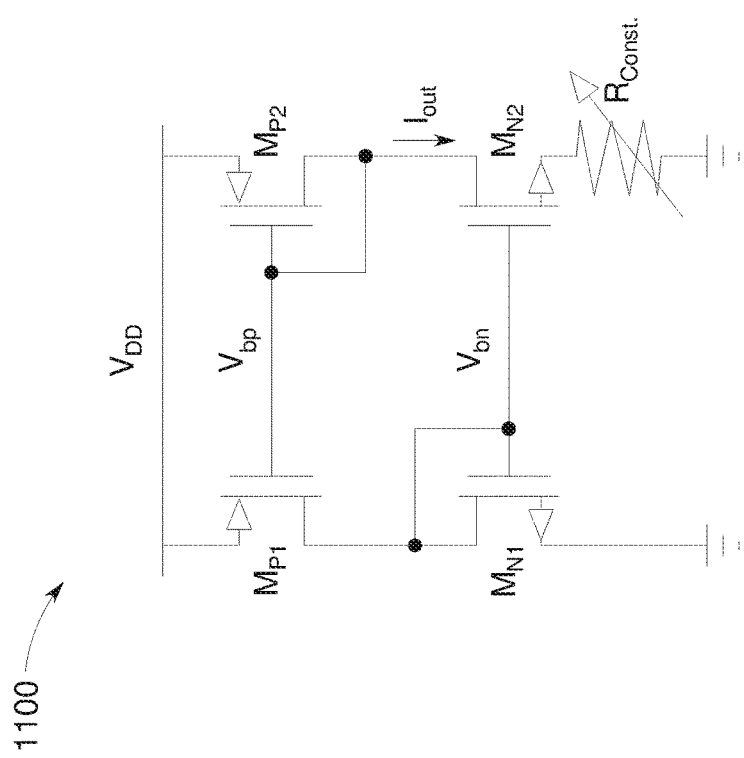
FIG. 11 depicts an exemplary constant transconductance ($g_m$) biasing circuit without cascodes, the constant transconductance reducing sensitivity of bandwidth and peaking in a source follower circuit over process, voltage and temperature (PVT).

FIG. 11 depicts an exemplary constant transconductance ($g_m$) biasing circuit without cascodes, the constant transconductance reducing sensitivity of bandwidth and peaking in a source follower circuit over process, voltage and temperature (PVT). The constant transconductance ($g_m$) biasing circuit without cascodes may bias a source follower, producing a constant transconductance. The constant transconductance may reduce bandwidth and peaking variation over process, voltage and temperature (PVT).

A constant-$g_m$ biasing circuit 1100 includes devices $M_{P1}$, $M_{N1}$, $M_{P2}$ and $M_{N2}$. The constant-$g_m$ biasing circuit 1100 includes a modeled device $R_{CONST}$. $R_{CONST}$ can be a resistor that is inherently constant over PVT, or a resistor that is calibrated to be constant over PVT. $R_{CONST}$ in conjunction with $M_{N1}$ and $M_{N2}$, may set the output current $I_{OUT}$ of the constant-$g_m$ biasing circuit 1100. By way of example and not limitation, the individual current sources 815 of FIG. 8A can be biased with voltages from FIG. 11. A current source mirror including the circuit of FIG. 11 may be implemented in conjunction with the individual current sources 815 of FIG. 8A. In some implementations, the constant-$g_m$ biasing circuit 1100 may reduce sensitivity to PVT in a source follower with inductive peaking. In various examples, the constant-$g_m$ biasing circuit 1100 may automatically provide a substantially PVT-invariant constant transconductance $g_m$.

Figures 12A, 12B, 12C:
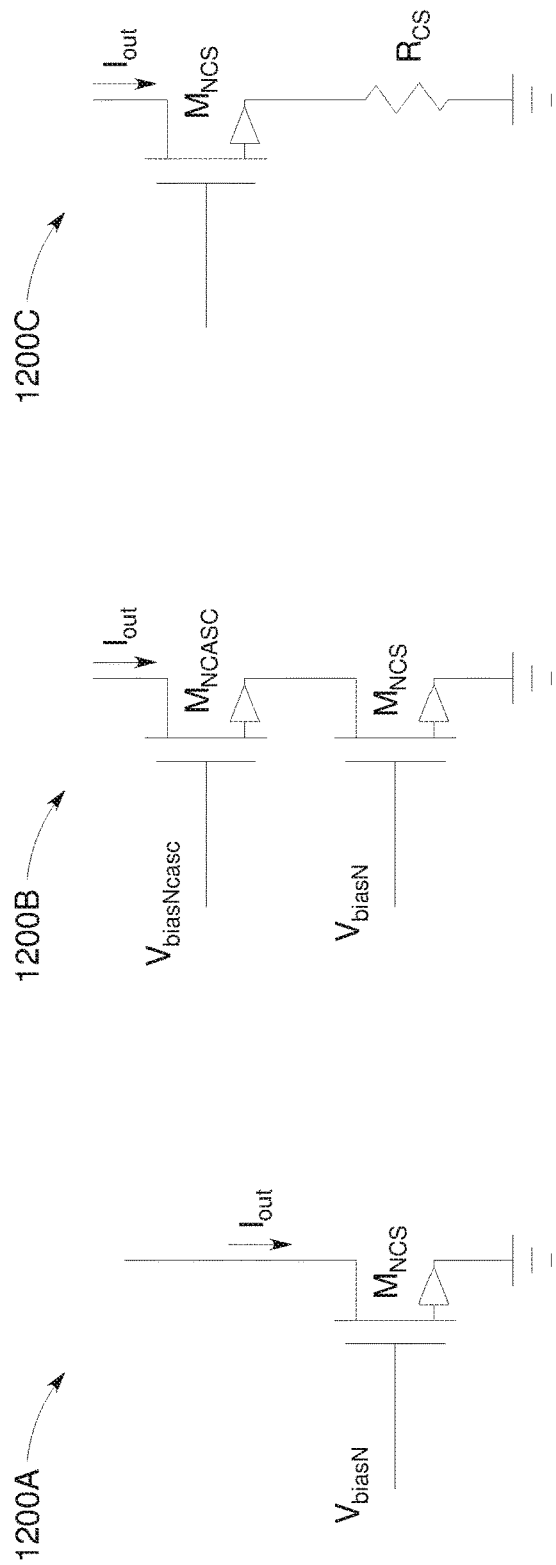
FIGS. 12A, 12B and 12C depict various exemplary current sources.

FIG. 12A depicts an exemplary current source. For example, a current source 1200A depicted in FIG. 12A includes current source transistor $M_{NCS}$. The current source 1200A may receive a bias voltage to generate a current $I_{OUT}$. For example, current source 1200A may receive a bias voltage from a constant-$g_m$ bias circuit to generate a PVT-varying current that may induce constant-$g_m$ in the current source 1200A.

By way of example and not limitation, the individual current sources 815 of FIG. 8A may be implemented as shown in FIG. 12A. Those skilled in the art may be familiar with the details of implementing a current source, such as the circuit of FIG. 12A, into the individual current sources 815 of FIG. 8A. In some implementations, the current source 1200A may reduce sensitivity to PVT in a source follower with inductive peaking. The constant-$g_m$ current source 1200A may include an automatic provision of substantially PVT-invariant constant-$g_m$.

FIG. 12B depicts an exemplary current source. For example, a current source 1200B depicted in FIG. 12B includes a current source transistor $M_{NCS}$ and a cascode transistor $M_{NCASC}$. The current source 1200B may receive a bias voltage to generate a current $I_{OUT}$. For example, current source 1200B may receive a bias voltage from a constant-$g_m$ bias circuit to generate a PVT-varying current that may induce constant-gm in the current source 1200B.

By way of example and not limitation, the individual current sources 815 of FIG. 8A may be implemented as shown in FIG. 12B. Those skilled in the art may be familiar with the details of implementing a current source, such as the circuit of FIG. 12B, into the individual current sources 815 of FIG. 8A. In some implementations, the current source 1200B may reduce sensitivity to PVT in a source follower with inductive peaking. The constant-$g_m$ current source 1200B may include an automatic provision of substantially PVT-invariant constant-$g_m$.

FIG. 12C depicts an exemplary current source. For example, a source 1200C depicted in FIG. 12C includes a current source transistor $M_{NCS}$ and a current set resistor $R_{CS}$. The current source 1200C may receive a bias voltage to generate a current $I_{OUT}$. For example, current source 1200C may receive a bias voltage from a constant-$g_m$ bias circuit to generate a PVT-varying current that may induce constant-gm in the current source 1200C.

By way of example and not limitation, the individual current sources 815 of FIG. 8A may be implemented as shown in FIG. 12C. Those skilled in the art may be familiar with the details of implementing a current source, such as the circuit of FIG. 12C, into the individual current sources 815 of FIG. 8A. In some implementations, the current source 1200C may reduce sensitivity to PVT in a source follower with inductive peaking. The constant-$g_m$ current source 1200C may include an automatic provision of substantially PVT-invariant constant-$g_m$.

Figures 13A, 13B:
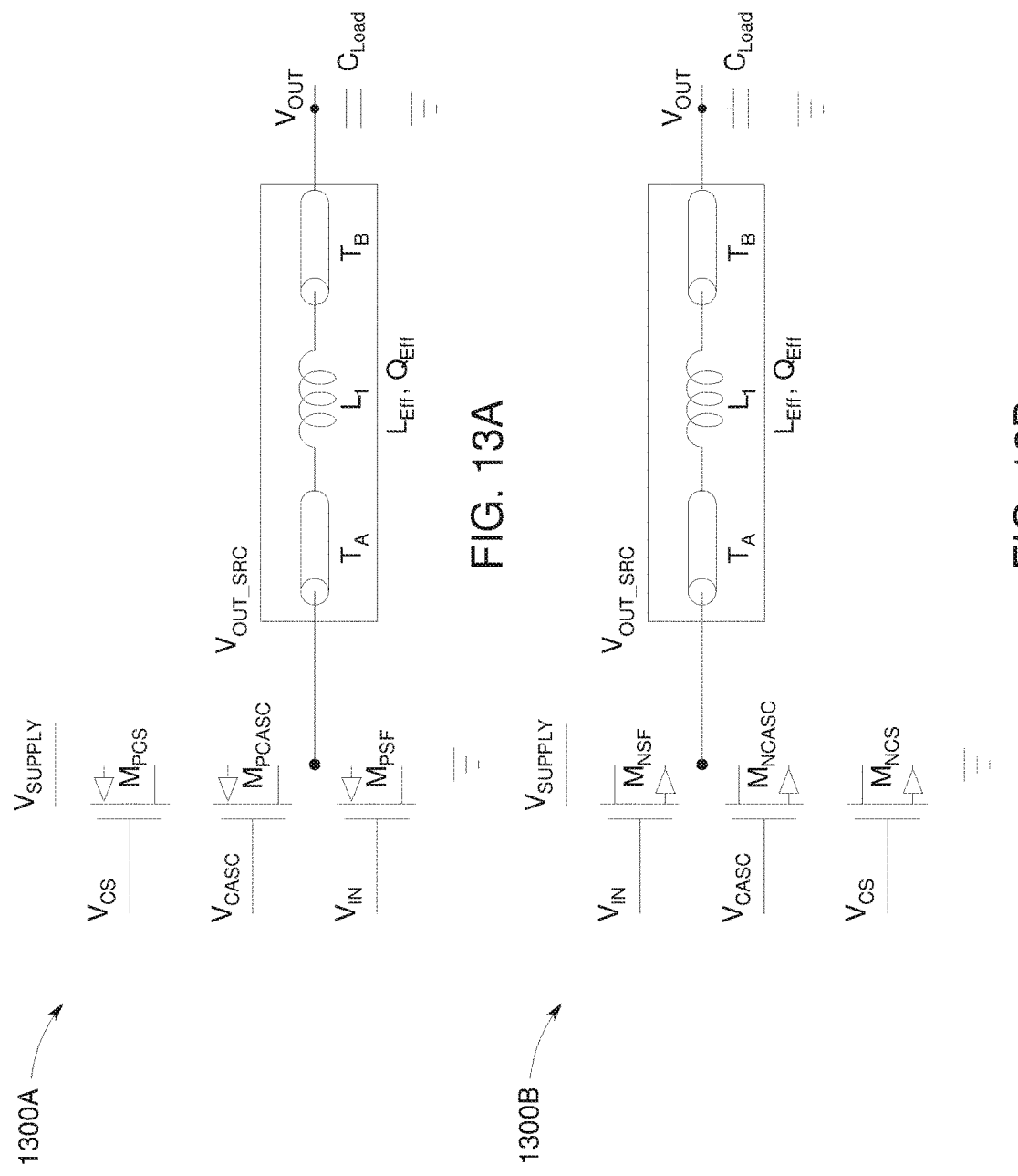
FIG. 13A depicts a P-channel metal-oxide semiconductor (PMOS) type source follower with series peaking.
FIG. 13B depicts an N-channel metal-oxide semiconductor (NMOS) type source follower with series peaking.

FIG. 13A depicts a PMOS type source follower with series peaking. A PMOS type source follower with series peaking 1300A includes a PMOS type source follower. The PMOS type source follower includes a main current source transistor $M_{PCS}$, a cascode transistor $M_{PCASC}$ and the buffering transistor $M_{PSF}$. The PMOS type source follower with series peaking 1300A includes traces $T_A$ and $T_B$. The traces $T_A$ and $T_B$ include an implicit inductance. The PMOS type source follower with series peaking 1300A includes an explicit inductor L1. The implicit inductance from traces $T_A$ and $T_B$ in combination with the explicit inductance of inductor L1 may produce a lumped inductance model $L_{eff}$ and lumped quality model $Q_{eff}$. The PMOS type source follower with series peaking 1300A drives a capacitive load $C_{LOAD}$. The peaked output response produced by the lumped inductance model $L_{eff}$ and/or the lumped quality model $Q_{eff}$ may advantageously extend the bandwidth of in the presence of various capacitive loads. In some examples, implementation of a constant-$g_m$ current source may reduce sensitivity to PVT in a source follower with inductive peaking (e.g., 1300A). The constant-$g_m$ current source may include an automatic provision of substantially PVT-invariant constant-$g_m$.

FIG. 13B depicts an NMOS type source follower with series peaking. Those skilled in the art may recognize that the circuit depicted in FIG. 13A may be implemented in complementary MOS (NMOS) technology as shown in FIG. 13B. An NMOS type source follower with series peaking 1300B includes an NMOS type source follower. The NMOS type source follower includes a current source transistor $M_{NCS}$, a cascode transistor $M_{NCASC}$ and a buffering transistor $M_{NSF}$. The NMOS type source follower with series peaking 1300B includes traces $T_A$ and $T_B$. The traces $T_A$ and $T_B$ include an implicit inductance. The PMOS type source follower with series peaking 1300B includes an explicit inductor L1. The implicit inductance from traces $T_A$ and $T_B$ in combination with the explicit inductance of inductor L1 may produce a lumped inductance model $L_{eff}$ and lumped quality model $Q_{eff}$. The NMOS type source follower with series peaking 1300B drives a capacitive load $C_{LOAD}$. The peaked output response produced by the lumped inductance model $L_{eff}$ and/or the lumped quality model $Q_{eff}$ may advantageously extend the bandwidth in the presence of various capacitive loads. In some examples, implementation of a constant-$g_m$ current source may reduce sensitivity to PVT in a source follower with inductive peaking (e.g., 1300B). The constant-$g_m$ current source may include an automatic provision of substantially PVT-invariant constant-$g_m$.

Various computing arrangements, including one or more processors and a memory arrangement configured with program code, may be suitable for hosting the processes and data structures that may carry out functions disclosed herein. The processes may be provided via a variety of computer-readable storage media or delivery channels such as electronic storage devices, or as application services over a network.

Though aspects and features may in some cases be described in individual figures, features from one figure may be combined with features of another figure even though the combination is not explicitly shown or explicitly described as a combination.

The methods and system may be applicable to a variety of systems that employ RAM circuits. Other aspects and features will be apparent to those skilled in the art from consideration of the specification. The portions of the methods and systems may be implemented as one or more processors configured to execute software, as an application specific integrated circuit (ASIC), or as a logic on a programmable logic device. Moreover, the various circuits identified herein may share hardware circuitry, such as a computer processing unit or digital processing unit. It is intended that the specification and drawings be considered as examples only, with a true scope being indicated by the claims herein.

Although various embodiments have been described with reference to the figures, other embodiments are possible. For example, various follower circuits may be implemented as source followers, which may advantageously operate with substantially low current. In some examples, various follower circuits may be implemented as emitter followers. Pre-buffers may take the form of various types of source buffers. In various examples, a pre-buffer may be one or more buffers of one type or a combination of one or more types.

Various peaking/pre-emphasis modules may provide a substantial advantage above 2 GHz, for example, when pre-conditioning signals for high speed data conversion products. For example, the various peaking/pre-emphasis modules may be employed in high-speed time-interleaved ADCs. Such high-speed time-interleaved ADCs may be employed in various SERDES designs, for example.

In some implementations, a pre-buffer may be a continuous time linear equalizer (CTLE). The pre-buffers may drive one or more downstream loads. The downstream loads may be one type or a combination of one or more types. The pre-buffer may achieve one or more functions. For example, the pre-buffer may isolate the high capacitance of a track-and-hold stage from an input source buffer. In various implementations, the pre-buffer may provide bandwidth extension of a track-and-hold buffer.

A source follower bandwidth may be characterized as $g_m/C_{LOAD}$. Keeping $g_m$ constant over PVT may reduce sensitivity of the follower bandwidth for a fixed $C_{LOAD}$. In various examples, if the current generated in a constant-$g_m$ biasing circuit, such as the one depicted in FIGS. 10 and 11, is fed to a source follower stage, its $g_m$ may be substantially constant, even in the presence of variations in PVT. As depicted in FIGS. 10 and 11, $R_{CONST}$ may be a fine-tolerance on-chip or off-chip resistor. In some examples, $R_{CONST}$ may be a calibrated on-chip resistor. Employment of constant-$g_m$ may maintain a substantially constant bandwidth, a constant peaking response and/or a constant phase distortion profile. Constant-$g_m$ may be compatible with a programmable source follower implementation and may provide a very robust and flexible implementation of a source follower.

The method of constant-$g_m$ biasing may not be restricted to the circuit diagrams shown herein. For example, applicable constant-$g_m$ biasing circuits with various levels of accuracy and/or complexity may be employed. In some implementations, a complementary architecture where the rails are swapped, and each PMOS device is replaced with an NMOS device, and vice versa, may be employed. Various embodiments may be augmented to inaccuracies due to MOS channel length modulation and the MOS body effect. Further, various embodiments may be augmented to reliably start up at power-on.

The series inductive peaking network depicted in, for example, in FIG. 6A may be adapted provide bandwidth extension with a flat AC magnitude response (e.g., no peaking). In some examples, a series inductive peaking network may be adapted to provide a frequency response with peaking. In some implementations, where one or more series inductive peaking networks are cascaded, each network may be adapted for peaking or bandwidth extension. In some implementations, one or more networks in combination may be adapted for no peaking or bandwidth extension. Accordingly, multiple combinations of cascaded networks may exist.

The source follower may be of the NMOS or PMOS type. In implementations where two or more source followers are cascaded, each source follower may be NMOS or PMOS type. NMOS and PMOS types may be implemented alone or in combination. Further, if NMOS and PMOS devices are employed in combination, an NMOS type of constant-$g_m$ circuit may be implemented to bias the NMOS source followers, and a PMOS type of constant-$g_m$ circuit may bias the PMOS source followers.

In some examples, various inductive elements may be explicit. In various examples, one or more of the explicit inductive elements may be coiled conductors. The term "explicit" may be defined as being a physical element instance. Explicit inductive elements may have a defined boundary and may be placed in a defined location. Explicit inductive elements may be employed as the peaking inductance of various peaking/pre-buffers.

In some examples, various inductive elements may be implicit. In some implementations, one or more of the implicit inductances may be various signal distribution metal tracks in various semiconductor implementations. The term "implicit" may be defined as being a physical inductance consequential to trace geometry. Implicit inductive elements may be employed as the peaking inductance(s) of various peaking/pre-buffers.

Those skilled in the art may recognize one or more known methods for implementation of the switches shown in the diagrams. The switch implementations are therefore considered peripheral to the core concepts presented herein.

Those skilled in the art may recognize techniques for implementing the functions shown as N-channel designs with P-channel devices. Conversely, those skilled in the art may recognize techniques for implementing the functions shown as P-channel designs with N-channel devices. Further, input signals and output signals for the complementary designs may function inversely.

Various examples of modules may be implemented using circuitry, including various electronic hardware. By way of example and not limitation, the hardware may include transistors, resistors, capacitors, switches, integrated circuits and/or other modules. In various examples, the modules may include analog and/or digital logic, discrete components, traces and/or memory circuits fabricated on a silicon substrate including various integrated circuits (e.g., FPGAs, ASICs). In some embodiments, the module(s) may involve execution of preprogrammed instructions and/or software executed by a processor. For example, in the embodiment of FIG. 7, the module 705 may involve both hardware and software.

In an exemplary aspect, an integrated circuit (IC) apparatus may be adapted to extend a bandwidth of signals presented to an analog-to-digital converter. The IC apparatus may include an analog pre-buffer module $PB_n$. The IC apparatus may include an input terminal In and a driving output terminal $D_n$, configured as a source-follower output. The input terminal In may be connected to receive an input signal to be sampled and converted to a digital representation according to a voltage of each of the samples. The pre-buffer module $PB_n$ is configured to provide substantially unitary gain between the input terminal $I_n$ and the output terminal $D_n$.

The IC apparatus may include a signal transmission module $T_n$. The signal transmission module $T_n$ may include a transmission line segment $T_{nA}$, connected to receive the input signal at the output terminal $D_n$.

The signal transmission module $T_n$ may include a transmission line segment $T_{nB}$, which may be connected to convey the input signal to a capacitive load associated with an input terminal of a track-and-hold module.

The signal transmission module $T_n$ may include an inductor providing an effective inductance $L_n$, which may be connected to convey the input signal between the transmission line segment $T_{nA}$ and the transmission line segment $T_{nB}$.

In an illustrative example, if $L_n$ were substantially zero, then the input signal at the input terminal of the track-and-hold module may exhibit substantially unitary gain up to a frequency $f_1$ and may exhibit an attenuation at frequencies above $f_1$. During operation, $L_n$ may be set to a value that may cause greater-than-unity gain of the input signal at the input terminal of the track-and-hold module to at least partially offset the attenuation at frequencies between $f_1$ and a frequency $f_2$, where $f_2 > f_1$.

The IC apparatus may include a control input $C_n$ operably coupled to the analog pre-buffer module $PB_n$ to adjust, in response to a control signal, an effective current driving parameter associated with the driving output terminal $D_n$. The control signal may be responsive to a manual control input received from a user. The control signal may be responsive to an adaptive control module configured to automatically provide the control signal in response to a dynamically determined error signal associated with the input signal after being sampled and converted to a digital representation. The determined error signal may be determined from a data stream output by a digital-to-analog converter. The analog pre-buffer module $PB_n$ and the signal transmission module $T_n$ may be formed on a semiconductor die.

In some examples, the analog pre-buffer module $PB_n$ may include a plurality of buffers that may be operated in a selected combination to adjust the effective current driving parameter to produce an adjustable component of the current driving parameter responsive to the control signal. The analog pre-buffer module $PB_n$ may include at least one buffer that may produce a non-adjustable component of the current driving parameter that may combine with the adjustable component of the current driving parameter. The inductor may be formed, at least in part, by an integrated circuit's metal routing conductive paths situated above a semiconductor substrate. In some embodiments, the inductor may be implicit, that is, formed, at least in part, by a conductor formed from metal routing in the integrated circuit, situated above the semiconductor substrate. In some examples, the conductor may be an explicit coiled metal structure on the integrated circuit situated above the semiconductor substrate.

An integrated circuit (IC) apparatus may provide PVT sensitivity reduction to mitigate variations in the offset of the attenuation at frequencies between $f_1$ and $f_2$. The variations may be responsive to process, temperature, and voltage (PVT) conditions present in the IC apparatus. The sensitivity reduction provision may include automatically providing a substantially PVT-invariant transconductance $g_{mn}$ associated with the driving output terminal $D_n$. The PVT sensitivity reduction provision may include controlling an amplitude of the greater-than-unity gain of the input signal at the input terminal of the track-and-hold module.

In an exemplary aspect, an integrated circuit (IC) apparatus may be adapted to extend a bandwidth of signals presented to a capacitive load. The IC apparatus may include an analog pre-buffer module $PB_n$. The IC apparatus may include an input terminal In and a driving output terminal $D_n$, configured as a source-follower output. The input terminal In may be connected to receive an input signal. The pre-buffer module $PB_n$ is configured to provide substantially unitary gain between the input terminal $I_n$ and the output terminal Dn.

The IC apparatus may include a signal transmission module $T_n$. The signal transmission module $T_n$ may include a transmission line segment $T_{nA}$, connected to receive the input signal at the output terminal Dn.

The signal transmission module $T_n$ may include a transmission line segment $T_{nB}$, which may be connected to convey the input signal to a load input terminal of a capacitive load.

The signal transmission module $T_n$ may include an inductor providing an effective inductance Ln, which may be connected to convey the input signal between the transmission line segment $T_{nA}$ and the transmission line segment $T_{nB}$.

In an illustrative example, if $L_n$ were substantially zero, then the input signal at the load input terminal may exhibit substantially unitary gain up to a frequency $f_1$ and may exhibit an attenuation at frequencies above $f_1$. During operation, $L_n$ may be set to a value that may cause greater-than-unity high-frequency gain of the input signal at the load input terminal to at least partially offset the attenuation at frequencies between $f_1$ and a frequency $f_2$, where $f_2 > f_1$. The control signal may be responsive to an adaptive control module configured to automatically provide the control signal in response to a dynamically determined error signal associated with a data stream encoded in the input signal.

A number of implementations have been described. Nevertheless, it will be understood that various modifications may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. An integrated circuit (IC) apparatus adapted to extend a bandwidth of signals presented to an analog-to-digital converter, the IC apparatus comprising:
   an analog pre-buffer module $PB_n$ and having an input terminal $I_n$ and a driving output terminal $D_n$ configured as a source-follower output, the input terminal $I_n$ being connected to receive an input signal to be sampled and converted to a digital representation according to a voltage of each of the samples, wherein the pre-buffer module $PB_n$ is configured to provide substantially unitary gain between the input terminal $I_n$ and the output terminal $D_n$; and,
   a signal transmission module $T_n$ comprising:
      a transmission line segment $T_{nA}$ connected to receive the input signal at the output terminal $D_n$;
      a transmission line segment $T_{nB}$ connected to convey the input signal to a capacitive load associated with an input terminal of a Track-and-Hold module; and,
      an inductor providing an effective inductance $L_n$ and connected to convey the input signal between the transmission line segment $T_{nA}$ and the transmission line segment $T_{nB}$,
   wherein if Ln were substantially zero, then the input signal at the input terminal of the Track-and-Hold module would exhibit substantially unitary gain up to a frequency $f_1$ and an attenuation at frequencies above $f_1$, and wherein, during operation, $L_n$ is set to a value that causes greater-than-unity gain of the input signal at the input terminal of the Track-and-Hold module to at least partially offset the attenuation at frequencies between $f_1$ and a frequency $f_2$, where $f_2 > f_1$.

2. The IC apparatus of claim 1, further comprising a control input $C_n$ operably coupled to the analog pre-buffer module $PB_n$ to adjust, in response to a control signal, an effective current driving parameter associated with the driving output terminal $D_n$.

3. The IC apparatus of claim 2, wherein the control signal is responsive to a manual control input received from a user.

4. The IC apparatus of claim 3, wherein the control signal is responsive to an adaptive control module configured to automatically provide the control signal in response to a dynamically determined error signal associated with the input signal after being sampled and converted to a digital representation.

5. The IC apparatus of claim 4, wherein the determined error signal is determined from a data stream output by a digital-to-analog converter.

6. The IC apparatus of claim 2, wherein the analog pre-buffer module $PB_n$ further comprises a plurality of buffers that can be operated in a selected combination to adjust the effective current driving parameter to produce an adjustable component of the current driving parameter responsive to the control signal.

7. The IC apparatus of claim 6, wherein the analog pre-buffer module $PB_n$ further comprises at least one buffer that produces a non-adjustable component of the current driving parameter that combines with the adjustable component of the current driving parameter.

8. The IC apparatus of claim 1, wherein the analog pre-buffer module $PB_n$ and the signal transmission module $T_n$ are formed on a common semiconductor die.

9. The IC apparatus of claim 8, wherein the inductor is formed, at least in part, by routing conductive paths above a semiconductor substrate within an integrated circuit that contains the common semiconductor die.

10. The IC apparatus of claim 8, wherein the inductor is formed, at least in part, by a coiled conductor formed above a semiconductor substrate within an integrated circuit that contains the common semiconductor die.

11. The IC apparatus of claim 1, further comprising means for reducing sensitivity to process, voltage and temperature to mitigate variations in the offset of the attenuation at frequencies between the frequencies $f_1$ and $f_2$, wherein said variations are responsive to process, temperature, and voltage (PVT) conditions present in the IC apparatus.

12. The IC apparatus of claim 11, wherein the sensitivity reducing means further comprises means for automatically providing a substantially PVT-invariant constant current associated with the driving output terminal $D_n$.

13. The IC apparatus of claim 11, wherein the sensitivity reducing means further comprises means for automatically providing a substantially PVT-invariant transconductance $g_{mn}$ associated with the driving output terminal Dn.

14. The IC apparatus of claim 13, wherein the sensitivity reducing means further comprises means for controlling an amplitude of the greater-than-unity high-frequency gain of the input signal at the input terminal of the Track-and-Hold module.

15. An integrated circuit (IC) apparatus adapted to extend a bandwidth of signals presented to a capacitive load, the IC apparatus comprising:
   an analog pre-buffer module $PB_n$ and having an input terminal $I_n$ and a driving output terminal $D_n$ configured as a source-follower output, the input terminal $I_n$ being connected to receive an input signal, wherein the pre-buffer module $PB_n$ is configured to provide substantially unitary gain between the input terminal $I_n$ and the output terminal $D_n$; and, a signal transmission module $T_n$ comprising:
- a transmission line segment $T_{nA}$ connected to receive the input signal at the output terminal $D_n$;
- a transmission line segment $T_{nB}$ connected to convey the input signal to a load input terminal of a capacitive load; and,
- an inductor providing an effective inductance $L_n$ and connected to convey the input signal between the transmission line segment $T_{nA}$ and the transmission line segment $T_{nB}$, wherein if Ln were substantially zero, then the input signal at the load input terminal would exhibit substantially unitary gain up to a frequency $f_1$ and an attenuation at frequencies above $f_1$, and wherein, during operation, $L_n$ is set to a value that causes greater-than-unity gain of the input signal at the load input terminal to at least partially offset the attenuation at frequencies between $f_1$ and a frequency $f_2$, where $f_2 > f_1$.

16. The IC apparatus of claim 15, further comprising a control input $C_n$ operably coupled to the analog pre-buffer module $PB_n$ to adjust, in response to a control signal, an effective current driving parameter associated with the driving output terminal $D_n$.

17. The IC apparatus of claim 16, wherein the control signal is responsive to a manual control input received from a user.

18. The IC apparatus of claim 16, wherein the control signal is responsive to an adaptive control module configured to automatically provide the control signal in response to a dynamically determined error signal associated with a data stream encoded in the input signal.

19. The IC apparatus of claim 16, wherein the analog pre-buffer module $PB_n$ further comprises a plurality of buffers that can be operated in a selected combination to adjust the effective current driving parameter to produce an adjustable component of the current driving parameter responsive to the control signal.

20. The IC apparatus of claim 19, wherein the analog pre-buffer module $PB_n$ further comprises at least one buffer that produces a non-adjustable component of the current driving parameter that combines with the adjustable component of the current driving parameter.

* * * * *